US006574168B2

(12) United States Patent
Hayashi

(10) Patent No.: US 6,574,168 B2
(45) Date of Patent: Jun. 3, 2003

(54) TIME MEASURING DEVICE AND TESTING APPARATUS

(75) Inventor: Mishio Hayashi, Tokyo (JP)

(73) Assignee: Advantest Corporation, Tokyo (JP)

( * ) Notice: Subject to any disclaimer, the term of this patent is extended or adjusted under 35 U.S.C. 154(b) by 84 days.

(21) Appl. No.: 09/946,320

(22) Filed: Sep. 5, 2001

(65) Prior Publication Data

US 2002/0041538 A1 Apr. 11, 2002

(30) Foreign Application Priority Data

Sep. 5, 2000 (JP) ....................................... 2000-268061

(51) Int. Cl.$^{7}$ ......................... G04F 10/00; G01R 13/02; G01R 25/00

(52) U.S. Cl. .................... 368/118; 368/121; 324/76.47; 324/76.77; 324/617

(58) Field of Search ................................ 368/113, 118, 368/120, 121; 324/76.24, 76.38, 76.41, 76.47, 76.77, 617

(56) References Cited

U.S. PATENT DOCUMENTS 4,769,798 A 9/1988 Hayashi ...................... 368/121
4,870,629 A * 9/1989 Swerlein et al. ............ 368/120
5,293,520 A * 3/1994 Hayashi ................... 324/76.77
5,325,049 A * 6/1994 Hayashi ................... 324/76.41

* cited by examiner

*Primary Examiner*—Vit Miska
(74) *Attorney, Agent, or Firm*—Rosenthal & Osha L.L.P.

(57) ABSTRACT

A time measuring device includes: an input signal detecting unit for detecting three or more edges in an input signal and to output three or more detection signals in parallel, the three or more detection signals changing based on the three or more edges, respectively; a converting unit for converting phase differences between change timings of the detection signals and clock edges in a reference clock having a predetermined operating frequency into analog voltage values, respectively; a counting unit for counting, from change timings of at least two of the detection signals, number of the clock edges between the clock edges from which at least two detection signals are respectively delayed by the phase differences corresponding to at least two detection signals; an operating unit for calculating a time interval between edges of the three or more edges based on the analog voltage values and the number of clock edges.

19 Claims, 16 Drawing Sheets

*Fig. 11A*

| PT1 | PT2 | PT3 | PT4 | PT5 | PT6 | PT7 | PT8 | | $2^0$ | $2^1$ | $2^2$ |
|---|---|---|---|---|---|---|---|---|---|---|---|
| 1 | 0 | 0 | 0 | 0 | 0 | 0 | 0 | | 0 | 0 | 0 |
| 1 | 1 | 0 | 0 | 0 | 0 | 0 | 0 | | 1 | 0 | 0 |
| 1 | 1 | 1 | 0 | 0 | 0 | 0 | 0 | ⇨ | 0 | 1 | 0 |
| 1 | 1 | 1 | 1 | 0 | 0 | 0 | 0 | | 1 | 1 | 0 |
| 1 | 1 | 1 | 1 | 1 | 0 | 0 | 0 | | 0 | 0 | 1 |
| 1 | 1 | 1 | 1 | 1 | 1 | 0 | 0 | | 1 | 0 | 1 |
| 1 | 1 | 1 | 1 | 1 | 1 | 1 | 0 | | 0 | 1 | 1 |
| 1 | 1 | 1 | 1 | 1 | 1 | 1 | 1 | | 1 | 1 | 1 |

*Fig. 11B*

| | $D_0$ $D_1$ $D_2$ ---------- $D_{P-1}$ | $D_P$ |
|---|---|---|
| #Φ | 0 0 0 ---------- 0 | 0 |
| #1 | (CLOCK-EDGE NUMBER BETWEEN RISING EDGES OF PT1 AND PT2) | 0 |
| #2 | (CLOCK-EDGE NUMBER BETWEEN RISING EDGES OF PT1 AND PT3) | 0 |
| #3 | (CLOCK-EDGE NUMBER BETWEEN RISING EDGES OF PT1 AND PT4) | 0 |
| #4 | (CLOCK-EDGE NUMBER BETWEEN RISING EDGES OF PT1 AND PT5) | 0 |
| #5 | (CLOCK-EDGE NUMBER BETWEEN RISING EDGES OF PT1 AND PT6) | 0 |
| #6 | (CLOCK-EDGE NUMBER BETWEEN RISING EDGES OF PT1 AND PT7) | 0 |
| #7 | (CLOCK-EDGE NUMBER BETWEEN RISING EDGES OF PT1 AND PT8) | 0 |

*Fig. 11C*

| $D_0$ $D_1$ $D_2$ ---------- $D_{P-1}$ | $D_P$ |
|---|---|
| 0 0 0 ---------- 0 | 0 |
| 1 1 1 ---------- 1 | 1 |
| 1 1 1 ---------- 1 | 1 |
| (CLOCK-EDGE NUMBER BETWEEN RISING EDGES OF PT1 AND PT4) | 0 |
| 1 1 1 ---------- 1 | 1 |
| 1 1 1 ---------- 1 | 1 |
| 1 1 1 ---------- 1 | 1 |
| (CLOCK-EDGE NUMBER BETWEEN RISING EDGES OF PT1 AND PT8) | 0 |

TIME MEASURING DEVICE AND TESTING APPARATUS

This patent application claims priority based on a Japanese patent application, 2000-268061 filed on Sep. 5, 2000, the contents of which are incorporated herein by reference.

BACKGROUND OF THE INVENTION

1. Field of the Invention

The present invention relates to a time measuring device, a testing apparatus and a shift register. More particularly, the present invention relates to a time measuring device that can measure small time intervals between edges of a signal with high precision.

2. Description of the Related Art

As a conventionally known time measuring device for measuring a period of a rectangular wave, for example, U.S. Pat. No. 4,769,798 discloses an apparatus that converts a value of the period of an input signal into a voltage value and outputs the voltage value.

Semiconductor device operating speed has dramatically increased in recent years. In a semiconductor memory device, for example, an operating frequency of a "Rambus" (registered trademark) DRAM (Dynamic Random Access Memory) exceeds 400 MHz. The period of a clock output from the Rambus DRAM is 2.5 ns or less and the measurement requires a precision of at least 10 ps.

The apparatus disclosed in the U.S. Pat. No. 4,769,798 performs an operation such as an analog operation or a sample-hold operation, for the input signal two times, so as to convert the period value of the input signal into the voltage value. Therefore, in order to measure the period of the clock of the Rambus DRAM by the conventional time measuring device, the operation has to be done within 2.5 ns, while the measurement precision is kept to at least 10 ps. In the conventional time measuring device, however, tradeoff relationship exists between the successive measurements and the measurement precision. Thus, the successive measurements of the period of the clock output from the Rambus DRAM with high precision were very difficult to obtain.

SUMMARY OF THE INVENTION

Therefore, it is an object of the present invention to provide a time measuring device, a testing apparatus and a shift register, which are capable of overcoming the above drawbacks accompanying the conventional art. The above and other objects can be achieved by combinations described in the independent claims. The dependent claims define further advantageous and exemplary combinations of the present invention.

According to the first aspect of the present invention, a time measuring device comprises: an input signal detecting unit operable to detect three or more edges in an input signal and to output three or more detection signals in parallel, the three or more detection signals changing based on the three or more edges, respectively; a converting unit operable to convert phase differences between change timings of the detection signals and clock edges in a reference clock having a predetermined operating frequency into analog voltage values, respectively; a counting unit operable to count, from change timings of at least two of the detection signals, numbers of the clock edges between the clock edges from which the at least two detection signals are respectively delayed by the phase differences corresponding to the at least two detection signals; an operating unit operable to calculate a time interval between edges of the three or more edges based on the analog voltage values and the numbers of clock edges.

The converting unit may output three or more timing signals that respectively change based on the clock edges; the counting unit may count, as the numbers of the clock edges, numbers of the clock edges between change timings of the three or more timing signals; a digital converting unit may be further provided to include an analog-digital converter operable to convert the analog voltage values into digital voltage values, respectively, and a voltage memory operable to store the digital voltage values; and the operating unit may calculate the time interval based on the numbers of clock edges and the digital voltage values.

The digital converting unit may include a selection unit operable to: receive the three or more timing signals; supply one of the analog voltage values that corresponds to one of the received timing signals, that was changed first, to the analog-digital converter; and select one of the analog voltage values that respectively corresponds to the remaining timing signals one by one other than the one timing signal that was changed first to supply the selected analog voltage values to the analog-digital converter one by one, based on an end of an operation for converting the analog voltage value that corresponds to the timing signal that was changed first into a corresponding digital voltage value by the analog-digital converter and changes of the timing signals.

The counting unit may include: a counter operable to count the number of clock edges; and a clock memory operable to store the number of clock edges counted by the counter. In this case, the received timing signals indicate addresses in the clock memory at which the number of clock edges corresponding to the received timing signals in accordance with an order in which the timing signals were received.

The counting unit may further include an address encoder operable to encode the addresses based on changes of the received timing signals.

The counting unit may count, as the number of clock edges, number of clock edges between a change timing of the one timing signal that changed first and change timings of the other timing signals than the one timing signal and stores the counted number of clock edges in the clock memory.

The operating unit may read the digital voltage values stored in the voltage memory and the number of clock edges stored in the clock memory to calculate the time interval.

The input signal detecting unit may include: a first shift register operable to output positive detection signals as the detection signals that change based on positive edges in the input signal, the positive edges being edges at which the input signal changes from logical L to logical H; and a second shift register operable to input an inverted input signal obtained by inverting the input signal and to output negative detection signals as the detection signals that change based on negative edges in the input signal, the negative edges being edges at which the inverted input signal changes from logical L to logical H, and wherein the three or more detection signals are output in parallel.

Each of the first and second shift registers may be a shift register including a plurality of flip-flops connected to each other, each flip-flop having a data input and a trigger input. Moreover, each of the flip-flops other than a last one of the flip-flops may supply data input to the data input thereof to the data input of a next flip-flop in accordance with an edge change in the input signal or inverted input signal that is input to the trigger input thereof, while the last flip-flop supplies data obtained by inverting the data input to the data input thereof to the data input of the first flip-flop in accordance with the edge change.

The converting unit may include: a first time-voltage converting unit operable to receive the positive detection signals, convert phase differences between change timings of the positive detection signals and the clock edges in the reference clock into positive analog voltage values as the analog voltage values, and output positive timing signals as the timing signals that change based on the clock edges and the positive analog voltage values; and a second time-voltage converting unit operable to receive the negative detection signals, convert phase differences between change timings of the negative detection signals and the clock edges in the reference clock into negative analog voltage values as the analog voltage values, and output negative timing signals as the timing signals that change based on the clock edges and the negative analog voltage values.

The digital converting unit may include a first digitizing unit and a second digitizing unit, the first voltage digitizing unit includes: a first selection unit as the selection unit operable to receive the positive analog voltage values and the positive timing signals and to select one of the positive analog voltage values to be converted into one of the corresponding digital voltage values; a first analog-digital converter as the analog-digital converter operable to convert the selected positive analog voltage value into a corresponding positive digital voltage value; and a first voltage memory as the voltage memory operable to store the positive digital voltage values. Moreover, the second voltage digitizing unit may include: a second selection unit as the selection unit operable to receive the negative analog voltage values and the negative timing signals and to select one of the negative analog voltage values to be converted into one of the corresponding digital voltage values; a second analog-digital converter as the analog-digital converter operable to convert the selected negative analog voltage value into a corresponding negative digital voltage value; and a second voltage memory as the voltage memory operable to store the negative digital voltage values.

The counting unit may include: a first clock counting unit having a first counter as the counter operable to receive the positive timing signals and to count the number of clock edges between change timings of the positive timing signals, and a first clock memory as the clock memory operable to store the number of clock edges counted by the first counter; and the second clock counting unit having a second counter as the counter operable to count the number of clock edges between change timings of the negative timing signals, and a second clock memory as the clock memory operable to store the number of clock edges counted by the second counter. Moreover, the change of the received positive timing signals may indicate addresses in the first clock memory at which the counted number of clock edges respectively corresponding to the received positive timing signals are stored, in accordance with an order in which the changes of the positive timing signals were received, and the change of the received negative timing signals may indicate addresses in the second clock memory at which the counted number of clock edges respectively corresponding to the received negative timing signals are stored, in accordance with an order in which the changes of the negative timing signals were received.

The time measuring device may further comprise an edge-difference counting unit operable to count a number of clock edges between a change timing of at least one of the positive timing signals and a change timing of at least one of the negative timing signals.

The edge-difference counting unit may count a number of clock edges between a change timing of one of the positive timing signals, that changed first after the first shift register was reset, and a change timing of one of the negative timing signals, that changed first after the second shift register was reset.

The first voltage digitizing unit may output a positive end signal that changes after all the positive digital values to be stored in the first voltage memory have been stored, while the second voltage digitizing unit outputs a negative end signal that changes after all the negative digital values to be stored in the second voltage memory have been stored. Moreover, the operating unit, after receiving a change of an end signal based on the positive end signal and the negative end signal, may read data from the first voltage memory, the second voltage memory, the first clock memory, the second clock memory and the edge-difference counting unit to calculate the time interval.

According to the second aspect of the present invention, a testing apparatus for testing an electronic device, comprises: a pattern generator operable to generate an input pattern signal to be input to the electronic device; a signal inputting/outputting unit operable to supply the input pattern signal to the electronic device while being in electric contact with the electronic device, and to receive an output pattern signal output from the electronic device based on the input pattern signal; and a detecting unit operable to detect the output pattern signal output from the electronic device, wherein the detecting unit includes: an input signal detecting unit operable to detect three or more edges in the output pattern signal and to output detection signals in parallel, the detection signals changing based on the three or more edges, respectively; a converting unit operable to convert phase differences between change timings of the detection signals and clock edges in a reference clock having a predetermined operating frequency into analog voltage values, respectively; a counting unit operable to count, from change timings of at least two of the detection signals, number of clock edges between the clock edges from which at least two detection signals are respectively delayed by the phase differences; and an operating unit operable to calculate a time interval between edges of the three or more edges based on the analog voltage values and the number of clock edges.

The testing apparatus may further comprise: a first transmission line, which connects the signal inputting/outputting unit with the converting unit electrically, operable to transmit the three or more detection signals; and a second transmission line, which connects the signal inputting/outputting unit with the input signal detecting unit electrically, operable to transmit the output pattern signal, wherein a transmission distance of the output pattern signal transmitted in the second transmission line is shorter than a transmission distance of one of the three or more detecting signal transmitted in corresponding the first transmission line. In this case, it is preferable that the first transmission line is a coaxial cable.

The testing apparatus may further comprise: a first transmission line, which connects the signal inputting/outputting unit to the converting unit electrically, operable to transmit the three or more detection signals; and a second transmission line, which connects the signal inputting/outputting unit to the input signal detecting unit electrically, operable to transmit the output pattern signal, wherein a signal time delay of the output pattern signal in the second transmission line is shorter than a signal time delay of one of the three or more detecting signal in the first transmission line. In this case, it is preferable that the first transmission line is a coaxial cable.

The summary of the invention does not necessarily describe all necessary features of the present invention. The present invention may also be a sub-combination of the features described above. The above and other features and advantages of the present invention will become more apparent from the following description of the embodiments taken in conjunction with the accompanying drawings.

BRIEF DESCRIPTION OF THE DRAWINGS

FIGS. 11A, 11B and 11C show a coding manner of the first address encoder and exemplary data stored in the first clock memory.

DETAILED DESCRIPTION OF THE INVENTION

The invention will now be described based on the preferred embodiments, which do not intend to limit the scope of the present invention, but exemplify the invention. All of the features and the combinations thereof described in the embodiment are not necessarily essential to the invention.

Figure 1:
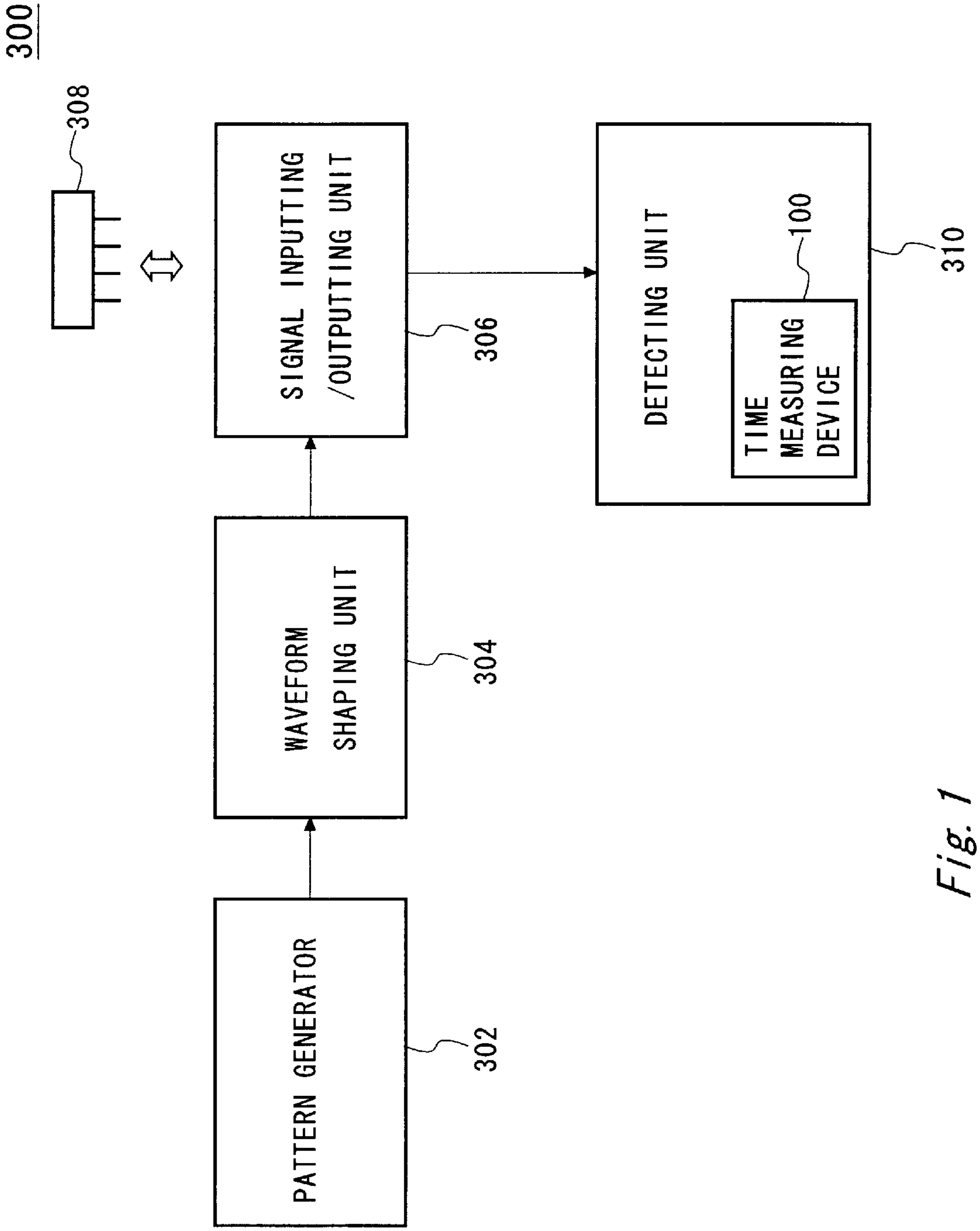
FIG. 1 shows a testing apparatus according to an embodiment of the present invention.

FIG. 1 schematically shows a testing apparatus 300 according to an embodiment of the present invention. The testing apparatus 300 includes a pattern generator 302 that generates a signal having a desired pattern; a waveform shaping unit 304 that shapes the waveform of the signal; a signal inputting/outputting unit 306 with which a device under test (DUT) 308 is brought into electrical contact and which is generally referred to as a test head; and a detecting unit 310 having a time measuring device 100 for measuring a time interval of the signal waveform. The time measuring device 100 includes an input signal detecting unit, a converting unit, a counting unit and an operating unit.

Next, an operation of the testing apparatus 300 is described. First, the pattern generator 302 generates an input pattern signal to be input to the DUT 308 in accordance with the input characteristics of the DUT 308 and supplies the generated input pattern signal to the waveform shaping unit 304. The waveform shaping unit 304 shapes the waveform of the input pattern signal and supplies the shaped input pattern signal to the signal inputting/outputting unit 306.

The DUT 308 receives the input pattern signal via the signal inputting/outputting unit 306 and then outputs an output pattern signal based on the received input pattern signal. In a case where the DUT 308 is a memory device, for example, data stored in the DUT 308 is output as the output pattern signal, based on the input pattern signal. In another case where the DUT 308 is an operating device, the result of the operation performed based on the input pattern signal is output as the output pattern signal. Please note that the term “electronic device” in the present application means a part that operates in a predetermined manner in accordance with a current or voltage, and includes, for example, a semiconductor device composed of active devices, such as an IC (Integrated Circuit) or LSI (Large-Scale Integrated circuit). Moreover, such a part may be provided on a wafer. Furthermore, such a part may include parts that are assembled into a unit to be accommodated in a single package or a part such as a breadboard in which a predetermined function is achieved by mounting these parts on a printed board.

The time measuring device 100 included in the detecting unit 310 receives the output pattern signal as an input signal. The input signal detecting unit of the time measuring device 100 detects changes of three or more edges in the input signal and outputs detection signals that change based on the three or more edges, respectively, in parallel. The converting unit of the time measuring device 100 receives the detection signals thus output, and converts a phase difference between a change timing of each detection signal and a clock edge in a reference clock having a predetermined period into an analog voltage value. The counting unit counts, from the change timings of at least two of the three or more detection signals, the number of clock edges between clock edges from which at least two detection signals are respectively delayed by corresponding phase differences. The operating unit calculates the time intervals between two of the three or more edges based on the analog voltage value and the number of clock edges thus counted.

Figure 2:
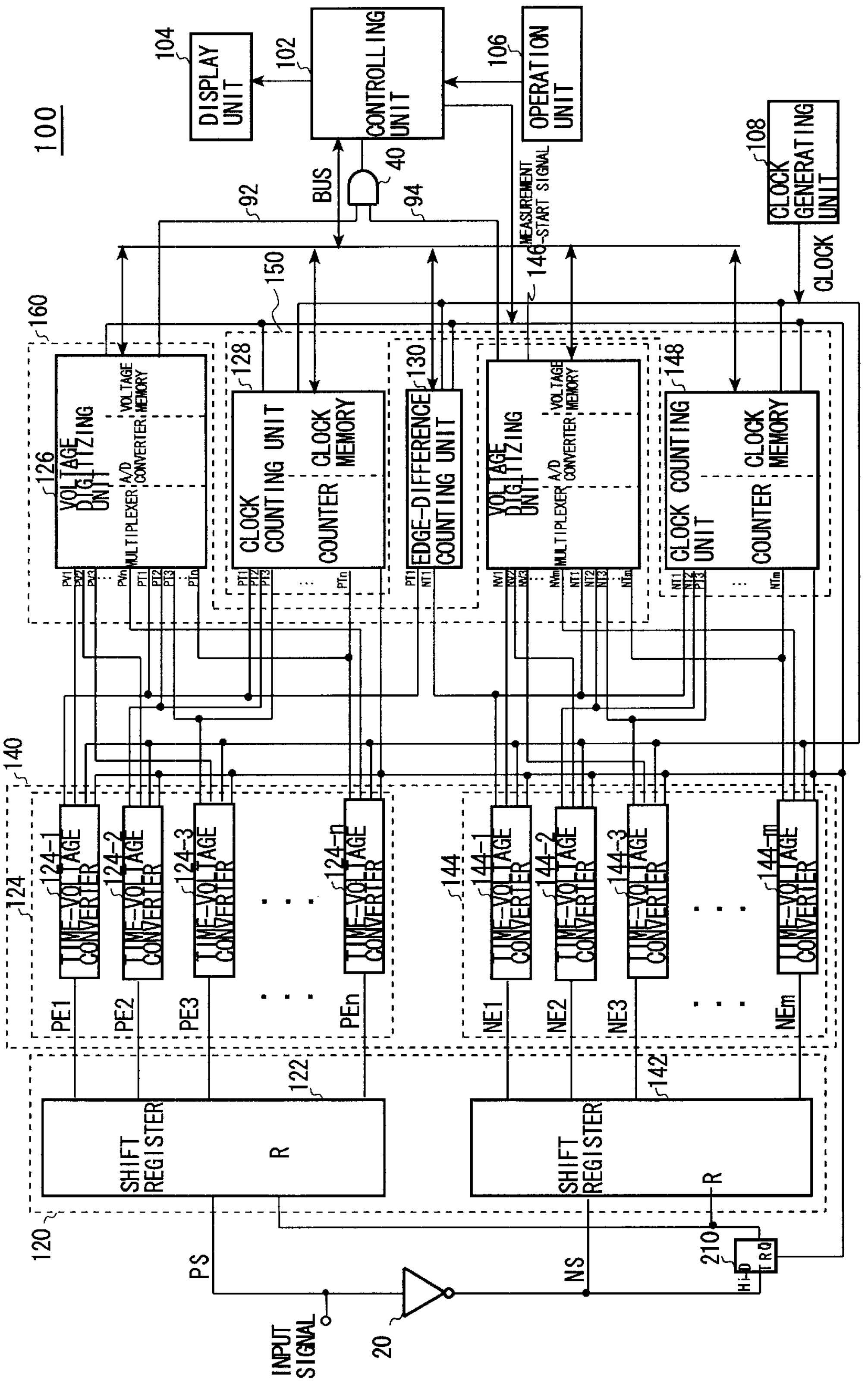
FIG. 2 shows a time measuring device according to an embodiment of the present invention.

FIG. 2 shows the time measuring device 100 according to an embodiment of the present invention. The time measuring device 100 includes a clock generator 108 that can generate a reference clock having a predetermined period; an input signal detecting unit 120 that detects the changes of three or more edges in the input signal and outputs in parallel three or more detection signals that change based on the detected three or more edges, respectively; a converting unit 140 for converting a phase difference between a timing of the change of each of the detection signals and a clock edge in the reference clock into an analog voltage value; a counting unit 150 for counting, from the change timings of at least two of the three or more detection signals, the number of clock edges between the clock edges from which at least two detection signals are respectively delayed by corresponding phase differences; and a controlling unit 102 as the operating unit for calculating the time intervals between the edges of the detected three or more edges based on the analog voltage value and the counted number of clock edges. Moreover, in the present embodiment, the time measuring device 100 further includes a digital converting unit 160 that can convert the analog voltage value output from the converting unit 140 into a digital value.

The input signal detecting unit 120 includes a first shift register 122 that outputs n (n is a positive integer) positive detection signals (PE1 to PEn) that change based on positive edges in the input signal PS at which the input signal PS changes from logical L to logical H; and a second shift register 142 that inputs an inversed input signal NS obtained by inverting the input signal PS and outputs m (m is a positive integer, where $(m+n)\geqq 3$) negative detection signals (NE1 to NEm) that change based on negative edges in the inversed input signal NS at which the inversed input signal NS changes from logical L to logical H.

The converting unit 140 includes a first time-voltage converting unit 124 and a second time-voltage converting unit 144. The first time-voltage converting unit 124 receives in parallel the positive detection signals (PE1 to PEn) output from the first shift register 122, and then converts the phase difference between the change timing of each of the positive detection signals (PE1 to PEn) and the clock edge in the reference clock 12 having a predetermined period into the analog voltage value, thereby obtaining the positive analog voltage values (PV1 to PVn). The obtained positive analog voltage values (PV1 to PVn) thus obtained and positive timing signals (PT1 to PTn) that respectively change based on the clock edges in the reference clock 12 are output in parallel from the first time-voltage converting unit 124. The second time-voltage converting unit 144 receives in parallel the negative detection signals (NE1 to NEm) output from the second shift register 142, and then converts the phase difference between the change timing of each of the negative detection signals (NE1 to NEm) and the clock edge in the reference clock 12 into the analog voltage value, thereby obtaining the negative analog voltage values (NV1 to NVm). The obtained negative analog voltage values (NV1 to NVm) thus obtained and negative timing signals (NT1 to NTm) that respectively change based on the clock edges are output in parallel from the second time-voltage converting unit 144.

The first time-voltage converting unit 124 has n time-voltage converters (124-1 to **124-*n*) that receive the positive detection signals (PE1 to PEn), respectively. Each of the n time-voltage converters (124-1 to 124-*n*) converts the phase difference corresponding to the received positive detection signal (PE1 to PEn) into the positive analog voltage value (PV1 to PVn), and outputs the positive timing signal (PT1 to PTn) and the positive analog value (PV1 to PVn) that correspond to the received positive detection signal. The second time-voltage converting unit 144 has m time-voltage converters (144-1 to 144-*m*) that receive the negative detection signals (NE1 to NEm), respectively. Each of the m time-voltage converters (144-1 to 144-*m***) converts the phase difference corresponding to the received negative detection signal (NE1 to NEm) into the negative analog voltage value (NV1 to NVm), and outputs the negative timing signal (NT1 to NTm) and the negative analog value (NV1 to NVm) for the corresponding negative detection signal (NE1 to NEm).

The digital converting unit 160 has a first voltage digitizing unit 126 and a second voltage digitizing unit 146. The first voltage digitizing unit 126 includes a first multiplexer as a selection unit that receives the positive analog voltage values (PV1 to PVn) and the positive timing signals (PT1 to PTn) that are output from the first time-voltage converting unit 124 and then selects one of the positive analog voltage values (PV1 to PVn) that is to be converted into a digital voltage value; a first analog-digital converter that converts the selected positive analog voltage value into a positive digital voltage value; and a first voltage memory for storing the positive digital value. The second voltage digitizing unit 146 includes a second multiplexer as a selection unit that receives the negative analog voltage values (NV1 to NVm) and the negative timing signals (NT1 to NTm) that are output from the second time-voltage converting unit 144 and then selects one of the negative analog voltage values (NV1 to NVm) that is to be converted into a digital voltage value; a second analog-digital converter that converts the selected negative analog voltage value into a negative digital voltage value; and a second voltage memory for storing the negative digital value.

The counting unit 150 has a first clock counting unit 128 and a second clock counting unit 148. The first clock counting unit 128 includes a first counter that receives the positive timing signals (PT1 to PTn) output from the first time-voltage converting unit 124 and counts the number of clock edges between the change timings of the positive timing signals (PT1 to PTn); and a first clock memory for storing the counted number of clock edges. The second clock counting unit 148 includes a second counter that receives the negative timing signals (NT1 to NTm) output from the second time-voltage converting unit 144 and counts the number of clock edges between the change timings of the negative timing signals (NT1 to NTm); and a second clock memory for storing the counted number of clock edges.

Moreover, in the present embodiment, the time measuring device 100 further includes an edge-difference counting unit 130 for counting the number of clock edges between the change timing of at least one of the positive timing signals (PT1 to PTn) and the change timing of at least one of the negative timing signals (NT1 to NTm).

Figure 3:
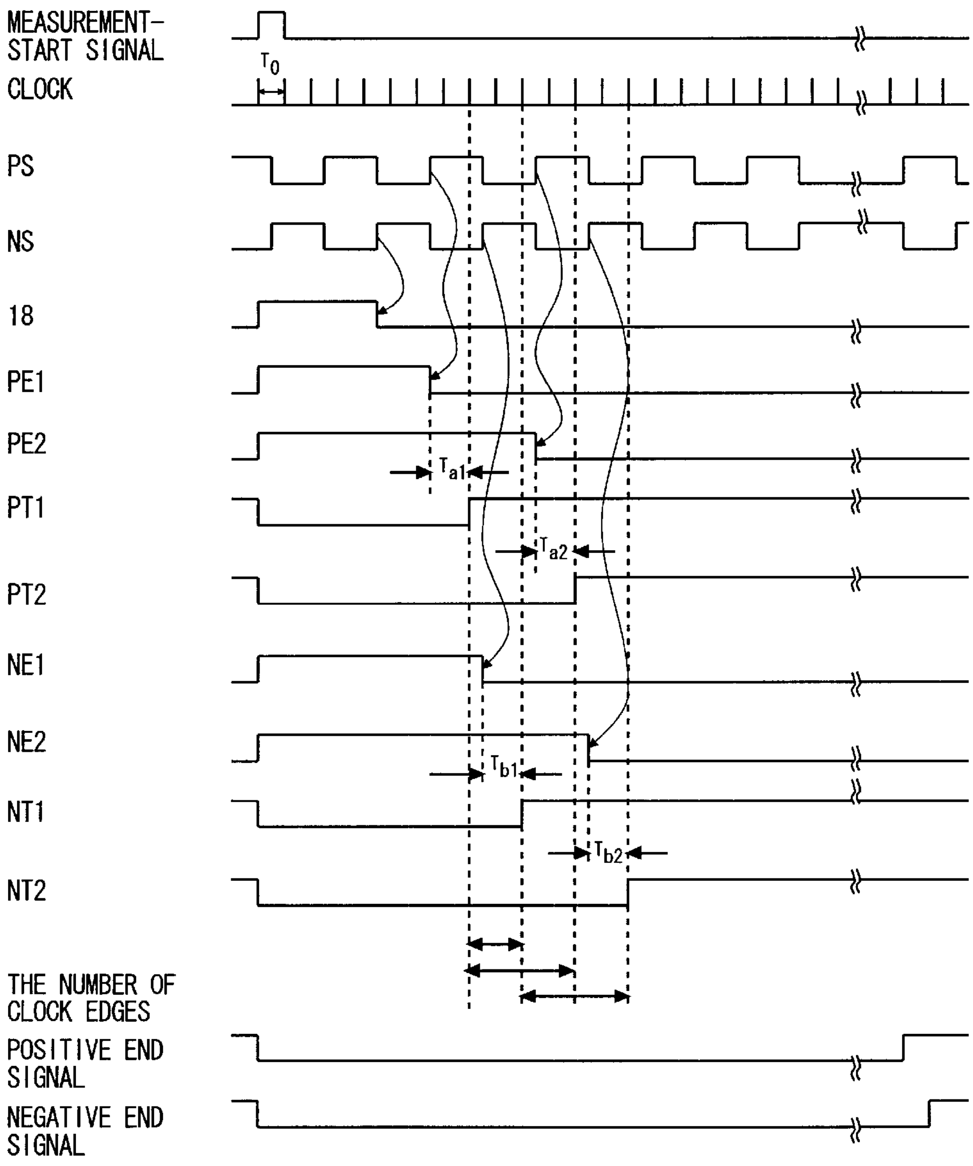
FIG. 3 is a timing chart of an operation of the time measuring device shown in FIG. 2.

FIG. 3 is a timing chart of the operation of the time measuring device 100 according to the present invention. Referring to FIGS. 2 and 3, the operation of the time measuring device 100 for measuring the time intervals between the edges included in the input signal PS is described. As a specific example, an operation in which two positive edges and two negative edges, all of which are included in the input signal PS, are detected and the time intervals between the thus detected four edges are measured is described.

Upon receiving an instruction input from a manipulation unit 106, the controlling unit 102 changes a measurement-start signal 10 that indicates the start of the measurement. The measurement-start signal 10 may be a pulse signal. In response to the change of the measurement-start signal 10, the first and second voltage digitizing units 126 and 146, the edge-difference counting unit 130, the first and second time-voltage converting units 124 and 144, and a flip-flop 210 receive the start of the measurement. Also, the clock generator 108 generates a clock having a predetermined period T0 and supplies the generated clock to the first and second time-voltage converting units 124 and 144, the first and second clock counting units 128 and 148, and the edge-difference counting unit 130.

After receiving the change of the measurement-start signal 10, the flip-flop 210 inverts its operation in response to an edge change of the inverted input signal NS obtained by inverting the input signal PS input to the time measuring device 100, so as to change a signal 18 to be supplied to the first and second shift registers 122 and 142, thereby resetting the first and second shift registers 122 and 142. The time measuring device 100 of the present embodiment includes an NOT circuit 20 that inverts a signal input thereto and outputs the inverted signal. Thus, in the time measuring device 100, the input signal PS is supplied to the first shift register 122 without being inverted, while being supplied to the second shift register 124 after being inverted by the NOT circuit 20 to be the inverted input signal NS. In an alternative embodiment, the time measuring device 100 may receive the input signal PS and the inverted input signal NS, so that the input signal PS is supplied to the first shift register 122 while the inverted input signal NS is supplied to the second shift register 142.

The first shift register 122 receives the input signal PS and detects a positive edge at which the input signal PS changes from logical L to logical H. Similarly, the second shift register 142 receives the inverted input signal NS and detects a negative edge at which the input signal PS changes from logical H to logical L, based on an edge change in the inverted input signal NS. From the relationship of the edges for inverting the flip-flop 210, the positive edge in the input signal PS is supplied to the first shift register 122 after the first and second shift registers 122 and 142 were reset.

After being reset, the first shift register 122 detects the positive edges of the input signal PS received, so as to output, in parallel, n positive detection signals including the first positive detection signal PE1 that changes based on the first detected positive edge in the input signal PS to the n-th positive detection signal PEn that changes based on the n-th detected positive edge of the input signal PS. Similarly, after being reset, the second shift register 142 detects the positive edges of the inverted input signal NS, that correspond to the negative edges of the input signal PS, so as to output in parallel m negative detection signals including the first negative detection signal NE1 that changes based on the first detected positive edge in the inverted input signal NS to the m-th negative detection signal NEm that changes based on the m-th detected positive edge in the inverted input signal NS. In FIG. 2, the first shift register 122 outputs the first positive detection signal PE1 that changes based on the first detected positive edge in the input signal PS and the second positive detection signal PE2 that changes the second detected positive edge in the input signal PS, after being reset. Similarly, the second shift register 142 outputs the first negative detection signal NE1 that changes based on the first detected positive edge of the inverted input signal NS (corresponding to the negative edge in the input signal PS) and the second negative detection signal NE2 that changes the second detected positive edge in the inverted input signal NS, after being reset.

The first time-voltage converting unit 124 receives the positive detection signals (PE1 to PEn) and then converts, for each of the positive detection signals (PE1 to PEn), a fraction time that is the phase difference between the change timing of the positive detection signal and a predetermined clock edge in the reference clock into the analog voltage value (PV1 to PVn) that corresponds to the fraction time. The first time-voltage converting unit 124 then changes the positive timing signals (PT1 to PTn) that indicate the timings of the clock edges corresponding to the respective positive detection signals (PE1 to PEn), and outputs the positive analog voltage values (PV1 to PVn). More specifically, it is preferable that the first time-voltage converting unit 124 include n time-voltage converters (124-1 to 124-*n*) in such a manner that the k-th positive detection signal PEk (k is an integer in the range of $1 \leqq k \leqq n$) output from the first shift register 122 is received by the k-th time-voltage converter 124-*k*. Then, the k-th time-voltage converter 124-*k* preferably changes the k-th positive timing signal PTk and outputs the positive analog voltage value PVk. In the present embodiment, the first time-voltage converter 124-1 outputs the positive analog voltage value PV1 corresponding to the fraction time $Ta_1$ that is the phase difference between the first positive detection signal PE1 and the corresponding clock edge, and also changes the first positive timing signal that indicates the timing of the corresponding clock edge. Similarly, the second time-voltage converter 124-2 outputs the positive analog voltage value PV2 corresponding to the fraction time $Ta_2$ that is the phase difference between the second positive detection signal PE2 and the clock edge corresponding to the second positive detection signal PE2, and also changes the second positive timing signal that indicates the timing of the corresponding clock edge.

The second time-voltage converting unit 144 receives the negative detection signals (NE1 to NEm) and then converts, for each of the negative detection signals (NE1 to NEm), a fraction time that is the phase difference between the change timing of the negative detection signal (NE1 to NEm) and the clock edge in the reference clock corresponding to that negative detection signal into the negative voltage value (NV1 to NVm) that corresponds to the fraction time. The second time-voltage converting unit 144 then changes the negative timing signals (NT1 to NTm) that indicate the timings of the clock edges corresponding to the respective negative detection signals (NE1 to NEm), and outputs the negative analog voltage values (NV1 to NVm). More specifically, it is preferable that the second time-voltage converting unit 144 include m time-voltage converters (144-1 to 144-*m*) in such a manner that the h-th negative detection signal NEh (h is an integer in the range of $1 \leqq h \leqq m$) output from the second shift register 142 is received by the h-th time-voltage converter 144-*h*. Then, the h-th time-voltage converter 144-*h* preferably changes the h-th negative timing signal NTh and outputs the negative analog voltage value NVh. In the present embodiment, the first time-voltage converter 144-1 outputs the negative analog voltage value NV1 corresponding to the fraction time $Tb_1$ that is the phase difference between the first negative detection signal NE1 and the clock edge corresponding to the first negative detection signal NE1, and also changes the first negative timing signal that indicates the timing of the corresponding clock edge. Similarly, the second time-voltage converter 144-2 outputs the negative analog voltage value NV2 corresponding to the fraction time $Tb_2$ that is the phase difference between the second negative detection signal NE2 and the clock edge corresponding to the second negative detection signal NE2, and also changes the second negative timing signal that indicates the timing of the corresponding clock edge.

The timing signal generated by the time-voltage converter is changed in accordance with a predetermined clock edge after the corresponding detection signal changed, thereby generating the analog voltage value corresponding to the fraction time. The predetermined clock edge maybe the x-th clock edge occurring after the change timings of the respective detection signals, where x is a positive integer and is determined in such a manner that the number x for each detection signal is the same as those for the other detection signals. In the present embodiment, in order to ensure the stable operations of the time-voltage converters, each of the time-voltage converters generates the timing signals at the second clock edges after the changes of the corresponding detection signals.

The first clock counting unit 128 receives the positive timing signals (PT1 to PTn) and counts the number of clock edges between the change timings of the respective positive timing signals (PT1 to PTn). In the present embodiment, the first clock counting unit 128 counts the number of clock edges $\alpha_{12}$ between the change timing of the first positive timing signal PT1 and the change timing of the second positive timing signal PT2. According to the present invention, the timing signal changes in accordance with the clock edge. Thus, the change of the timing signal is delayed from the clock edge by a small amount of time. Accordingly, in the present embodiment, the number of clock edges $\alpha_{12}$ between the change timing of the first positive timing signal PT1 and the change timing of the second positive timing signal PT2 is 4, as shown in FIG. 3.

The second clock counting unit 148 receives the negative timing signals (NT1 to NTm) and counts the number of clock edges between the timings at which the negative timing signals (NT1 to NTm) respectively change. In the present embodiment, the second clock counting unit 148 counts the number of clock edges $\beta_{12}$ between the change timing of the first negative timing signal NT1 and the change timing of the second negative timing signal NT2. The number of clock edges $\beta_{12}$ is 4, as shown in FIG. 3.

The first voltage digitizing unit 126 receives the positive timing signals (PT1 to PTn) and the positive analog voltage values (PV1 to PVn). The first multiplexer selects the positive analog value to be converted by the first analog-digital converter. The first analog-digital converter converts the selected positive analog voltage value into a positive digital voltage value and stores the positive digital value in the first voltage memory. Moreover, the first voltage digitizing unit 126 outputs a positive end signal that changes after all the positive digital voltage values to be stored in the first voltage memory have been stored.

The second voltage digitizing unit 146 receives the negative timing signals (NT1 to NTm) and the negative analog voltage values (NV1 to NVm). The second multiplexer selects the negative analog value to be converted by the second analog-digital converter. The second analog-digital converter converts the selected negative analog voltage value into a negative digital voltage value and stores the negative digital value in the second voltage memory. Moreover, the second voltage digitizing unit 146 outputs a negative end signal that changes after all the negative digital voltage values to be stored in the second voltage memory have been stored.

In the present embodiment, the positive and negative end signals are output from the digital converting unit 160. By an end signal based on the changes of the positive and negative end signals, the controlling unit 102 is notified that the measurement has been finished. This end signal may be output from one of the blocks that process data that was detected from the input signal PS and is required for an operation in the controlling unit 102, the one block being the last block that processes the detected data. The controlling unit 102 preferably starts the operation based on the change of the end signal output from that last processing block.

The edge-difference counting unit 130 receives the positive and negative timing signals, and counts the number of clock edges between the change timings of the positive and negative timing signals. In the present embodiment, the edge-difference counting unit 130 counts the number of clock edges $\gamma$ between the change timings of the detection signals PT1 and NT1. In FIG. 3, the number of the clock edges $\gamma$ is 2.

The controlling unit 102 starts the operation based on the end of the data processing by the digital converting unit 160. First, the controlling unit 102 reads data stored in the first and second voltage memories, the first and second clock memories and the edge-difference counting unit 130 via a bus. The controlling unit 102 then calculates the time intervals between the edges included in the input signal PS. In the present embodiment, the controlling unit 102 reads the digital voltage values respectively corresponding to the fraction times $Ta_1$, $Ta_2$, $Tb_1$ and $Tb_2$, the number of clock edges $\alpha_{12}$ and $\beta_{12}$, and the number of clock edges $\gamma$, so as to calculate the time intervals between the edges included in the input signal PS.

Next, an example of a circuit structure for achieving the operations of the respective units included in the time measuring device 100 described referring to FIGS. 2 and 3 and the detailed operations of the respective units are described.

Figure 4:
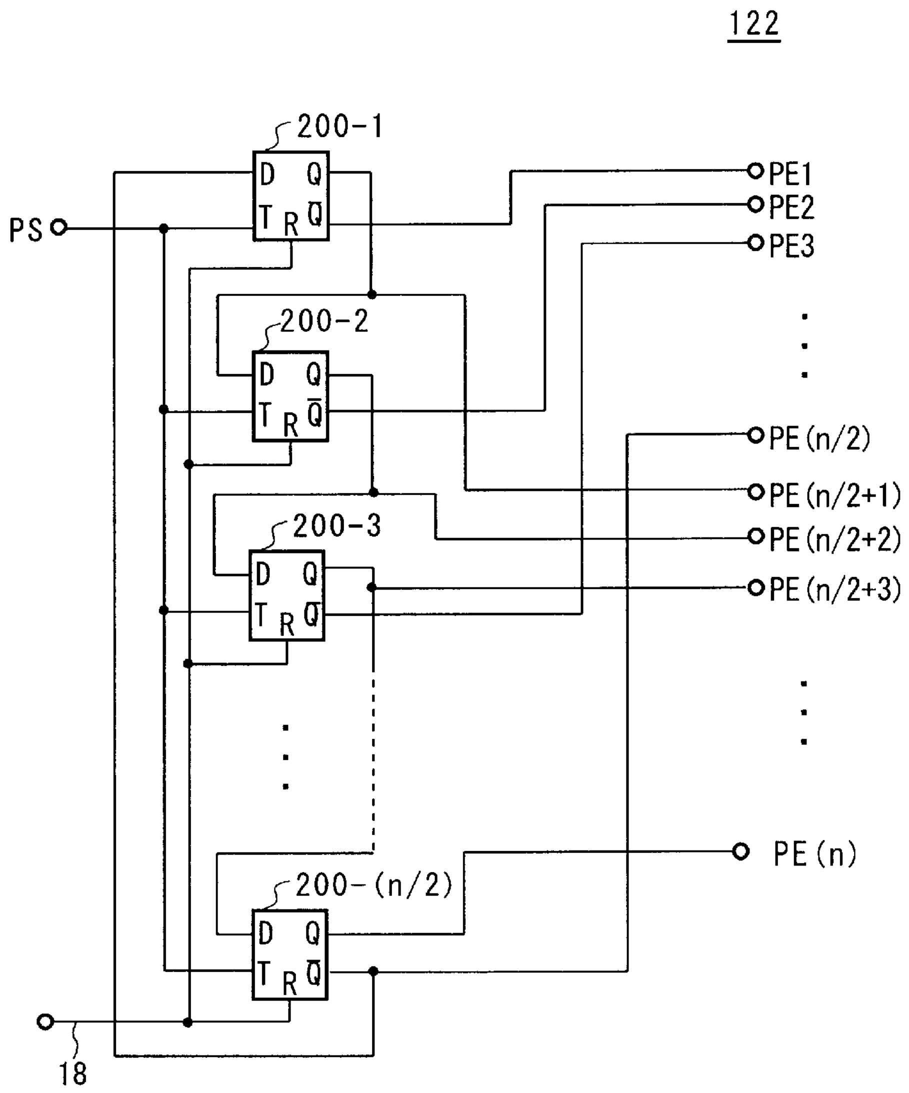
FIG. 4 shows an exemplary shift register included in an input signal detecting unit of the time measuring device according to the present invention.

FIG. 4 shows an exemplary shift register included in the input signal detecting unit 120. In FIG. 4, the structure and operation of the shift register according to the present invention are described referring to the first shift register 122 as an example. Preferably, the second shift register 142 has substantially the same structure as the first shift register 122.

The first shift register 122 has the structure in which a plurality of flip-flops, each of which has a data input D and a trigger input T, are connected in series. The flip-flop 200 supplies data input to the data input D thereof to the data input D of the next flip-flop in response to the edge change of the input signal PS or the inverted input signal NS that is input to the trigger input T. The last flip-flop (200-(*n*/2)) of the plurality of flip-flops 200 connected to each other supplies data obtained by inverting the data input to the data input D thereof to the data input D of the first flip-flop (200-1) in response to the edge change of the input signal PS or the inverted input signal NS that is input to the trigger input T thereof. In this example, the flip-flop 200, which is a D type flip-flop, outputs the logical value, which is input in the input terminal D, from the output terminal Q in response to the rising edge input in the trigger terminal T. In this example, during the signal 18 is logical H, the flip-flop 200 is in the reset state and output logical L form the output terminal Q.

Figure 5:
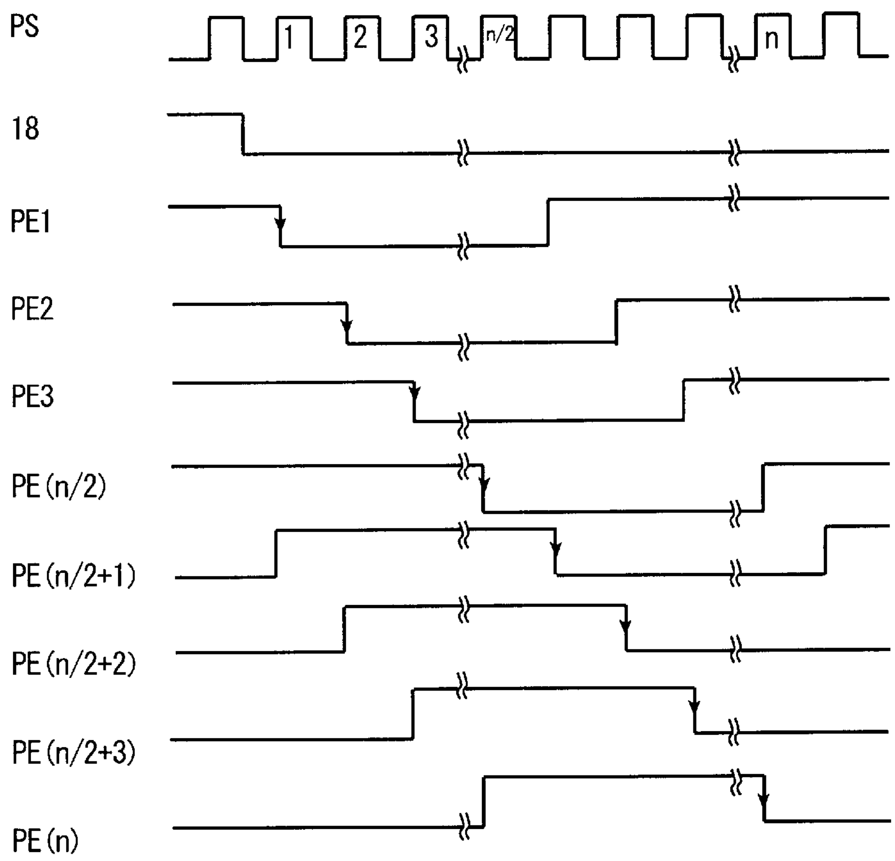
FIG. 5 is a timing chart of an operation of the first shift register shown in FIG. 4.

FIG. 5 is a timing chart of the operation of the first shift register 122. First, the flip-flops 200 included in the first shift register 122 are reset in response to logical H of the signal 18. The flip-flops 200 output logical L from outputs thereof at a time immediately after the reset has been released, and also output logical H from inverted outputs thereof.

After the first shift register 122 is reset, logical L is input to the data input D of the first flip-flop (200-1). The first flip-flop (200-1) changes its inverted output, which serves as the first positive detection signal PE1, from logical H to logical L in response to the first positive edge of the input signal PS. Simultaneously, the first flip-flop (200-1) changes its output, which serves as the (n/2+1)-th positive detection signal PE(n/2+1), from logical L to logical H and supplies this output to the data input D of the next flip-flop, i.e., the second flip-flop (200-2). The second flip-flop (200-2) changes the second positive detection signal PE2 by outputting, as its inverted output, logical L that is obtained by inverting logical H input to the data input D thereof, in response to the second positive edge of the input signal PS input to the trigger input T thereof.

The remaining flip-flops 200 operate in substantially the same manner so that the outputs of the flip-flops respectively change in response to the following positive edges of the input signal PS. The last flip-flop (200-(*n*/2)) supplies its inverted output to the data input D of the first flip-flop (200-1) in response to the positive edge of the input signal PS, that is the next edge to the input of logical H to the data input D of the last flip-flop (200-(*n*/2)). The first flip-flop (200-1) then changes the (n/2+1)-th positive detection signal PE(n/2+1) from logical H to logical L by outputting via its output logical L input to its data input D in response to the positive edge of the next input signal PS.

The shift register according to the present invention can output n detection signals by means of (n/2) flip-flops by feeding back the inverted output of the last flip-flop (200-(*n*/2)) to the data input D of the first flip-flop (200-1). In an alternative example, z detection signals (z is a positive integer) by using z flip-flops.

Figure 6:
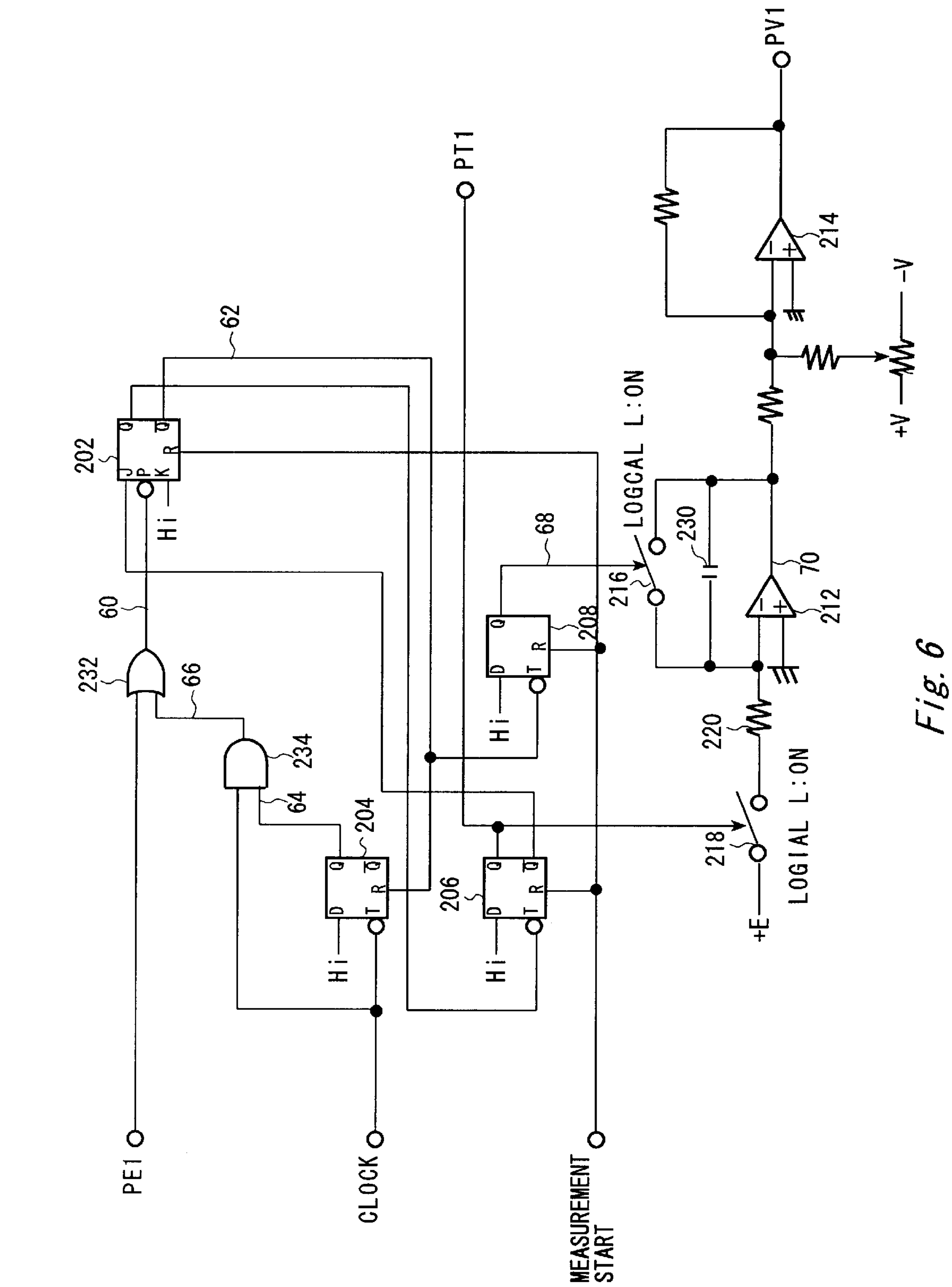
FIG. 6 shows an exemplary time-voltage converter.

FIG. 6 shows the time-voltage converter (124-1 to 124-*n*, 144-1 to 144-*m*). In FIG. 6, the time-voltage converter 124-1 included in the first time-voltage converting unit 124 is described as an example. The time-voltage converter 124-1 includes a timing generating circuit for generating the first positive timing signal PT1 and an integrating circuit for converting the fraction time between the change timings of the first positive detection signal PE1 and the first positive timing signal PT1 into the positive analog voltage value PV1. The integrating circuit has an operational amplifier 212, a condenser 230 and a resister 220.

Figure 7:
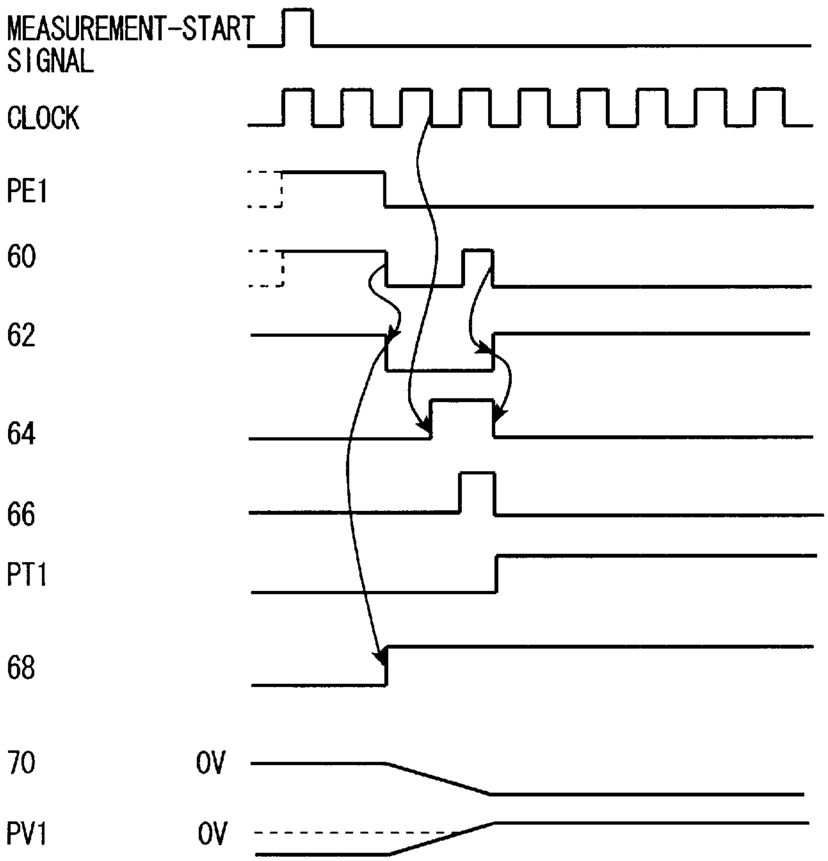
FIG. 7 is a timing chart of an operation of the time-voltage converter shown in FIG. 6.

FIG. 7 is a timing chart of an operation of the time-voltage converter 124-1. Referring to FIGS. 6 and 7, the operation of the time-voltage converter 124-1 is described. First, flip-flops (202, 206 and 208) are reset in response to the change of the measurement-start signal 10 output from the controlling unit 102 (shown in FIG. 2) Then, an output signal 60 of an OR circuit 232 changes to logical L in response to the change (negative edge) of the first positive detection signal PE1. The flip-flop 202 inverts its output and inverted output 62 in response to the negative edge of the output signal 60. The inverted output 62 is supplied to the trigger input T of the flip-flop 208. In response to the change of the inverted output 62, an output 68 of the flip-flop 208 changes from logical L to logical H. Then, in response to the change of the output 68, a switch 216 is opened, thereby charging of the integrating circuit starts. At this time, a switch 218 is short circuited and a reference voltage E is supplied to the register 220. The reference voltage E may be a negative potential. An operational amplifier 214 has a function of providing a predetermined amplification and a predetermined offset to an output 70 of the integrating circuit.

Since the change of the inverted output 62 of the flip-flop 202 from logical H to logical L releases the reset of the flip-flop 204, an output 64 of the flip-flop 204 also changes from logical L to logical H based on the negative edge of the clock 12. Then, based on the next negative edge of the clock 12, an output 66 of an AND circuit 234 changes from logical H to logical L. This negative edge is preferably a clock edge for which the fraction time from the change timing of the first positive detection signal PE1 is determined. In an alternative example, this positive edge may be a clock edge delayed from the change timing of the first positive detection signal PE1 by a predetermined phase. Then, the output 60 of the OR circuit 232 generates a negative edge based on the change of the output 66, so that the output of the flip-flop 202 is made logical L. The flip-flop 206 then changes its output, that is the positive timing signal PT1, from logical L to logical H. Moreover, the change of the output of the flip-flop 206 makes the switch 218 opened. Thus, the voltage of the output 70 of the integrating circuit is held. Also, the first positive analog voltage value PV1, that is an output of the operational amplifier 214, is held to a predetermined voltage and is output from the first time-voltage converter 124-1.

Figure 8:
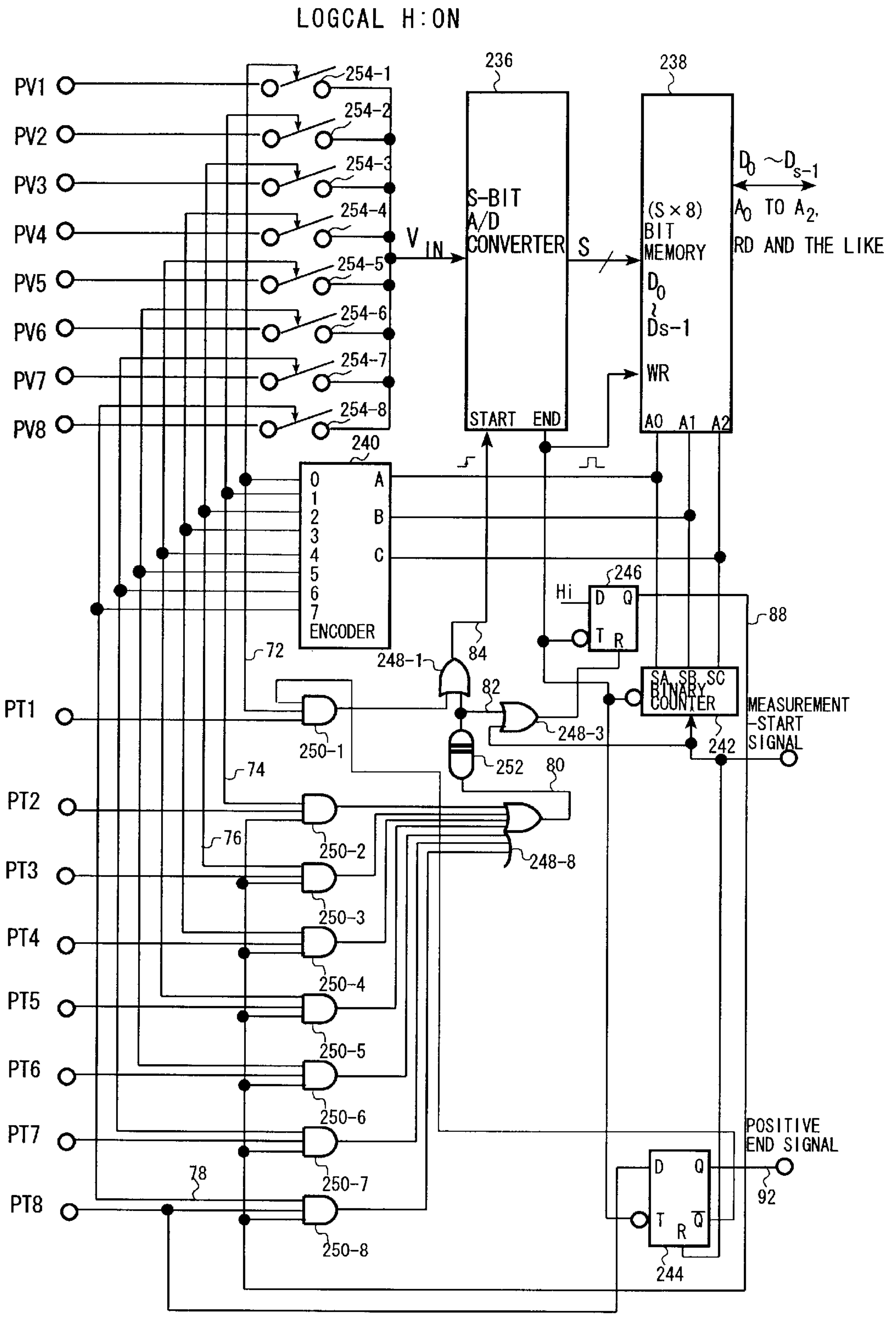
FIG. 8 shows an exemplary voltage digitizing unit included in a digital converting unit of the time measuring device according to the present invention.

FIG. 8 shows the voltage digitizing unit included in the digital converting unit. In FIG. 8, the first voltage digitizing unit 126 where n=8 is shown as an example. The first voltage digitizing unit 126 includes an analog-digital converter (A/D converter) 236 that coverts the positive analog voltage value (PV1 to PVn) into the corresponding digital voltage value; a voltage memory 238 for storing the digital voltage value obtained by the A/D conversion; and a multiplexer as a selecting unit that selects one of the received analog voltage values (PV1 to PVn), that is to be subjected to the A/D conversion.

The positive analog voltage values (PV1 to PV8) supplied from the first time-voltage converting unit 124 are supplied to the first A/D converter 236 via switches (254-1 to 254-8), respectively. In this example, each of the switches (254-1 to 254-8) is short circuited when logical H is supplied thereto, thereby supplying the corresponding positive analog voltage values (PV1 to PV8) to the first A/D converter 236.

When a positive edge is input to a start input of the first A/D converter 236, the first A/D converter 236 starts A/D conversion of the supplied positive analog voltage value (PV1 to PV8) into the corresponding digital voltage value. When that A/D conversion has been finished, the first A/D converter 236 outputs a positive pulse from an end output.

Figure 9:
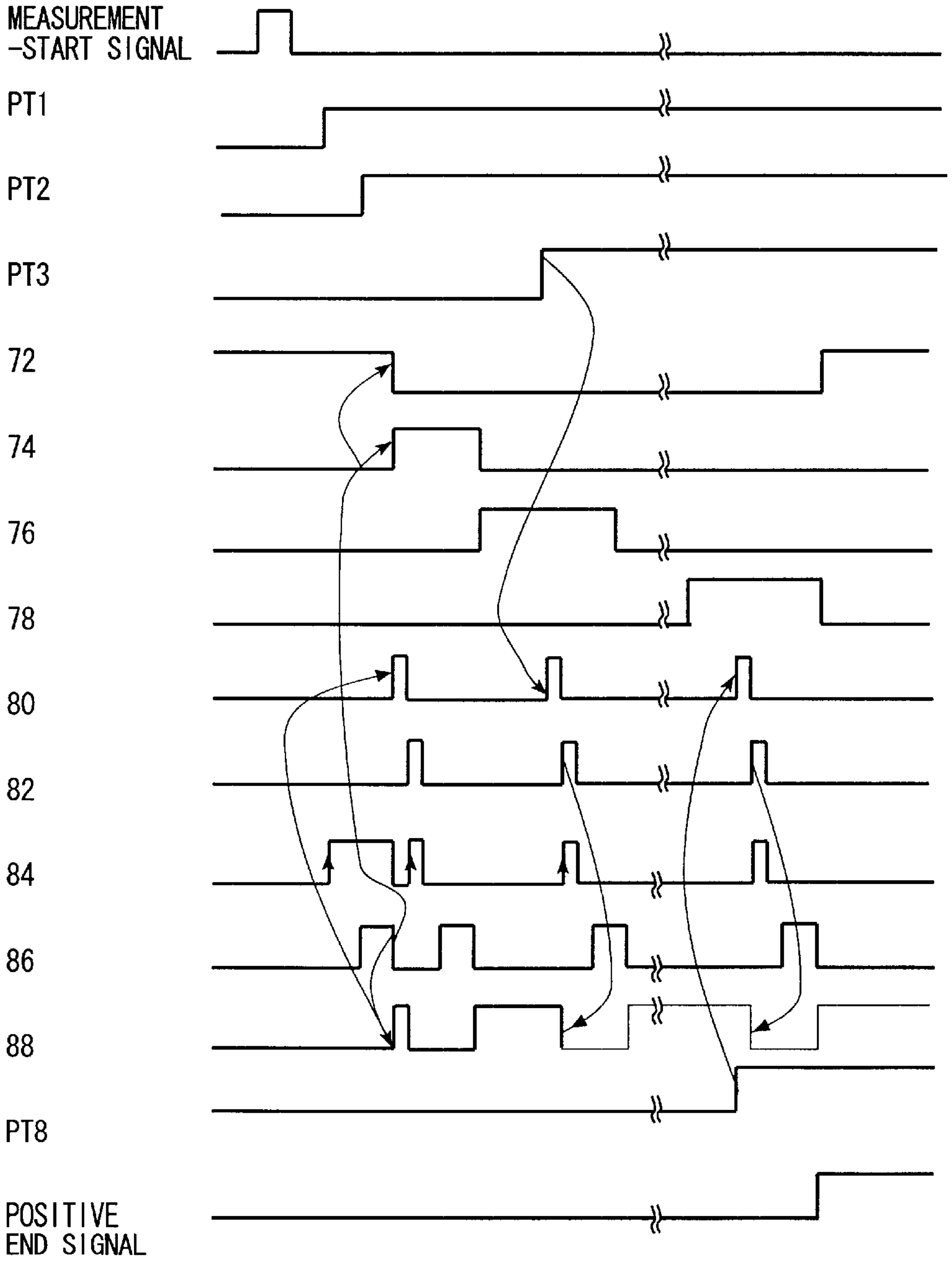
FIG. 9 is a timing chart of an operation of the first voltage digitizing unit shown in FIG. 8.

FIG. 9 is a timing chart of an operation of the first voltage digitizing unit 126 shown in FIG. 8. Referring to FIGS. 8 and 9, the operation of the first voltage digitizing unit 126 is described. First, in response to the change of the measurement-start signal 10, a binary counter 242 and flip-flops (244 and 246) are reset. An output "0" of an encoder 240 is logical H, while outputs "1" to "7" are logical L. In addition, the switches (254-2 to 254-8) are opened while the switch 254-1 is short circuited, so that the first positive analog voltage value PV1 is supplied to the first A/D converter 236.

When the first positive timing signal PT1 supplied to an AND circuit 250-1 changes from logical L to logical H, the AND circuit 250-1 outputs logical H. The first A/D converter 236 then receives the positive edge at the start input thereof via an OR circuit 248-1, so as to start the A/D conversion of the first positive analog voltage value PV1 supplied thereto. When the A/D conversion has been finished, the first A/D converter 236 outputs the positive pulse via the end output thereof. This positive pulse is supplied to a writing-control input WR of the first voltage memory 238, so that the first voltage memory 238 is placed in a writable state where a writing operation for the first voltage memory 238 is allowed. Thus, data obtained by the A/D conversion is written into "0" address in the first voltage memory 238.

The positive pulse output from the end output of the first A/D converter 236 is also supplied to the binary counter 242 and the flip-flop 246. The binary counter 242 increases its counted value from "0" to "1" in accordance with the negative edge of the positive pulse. Then, the output "1" of the encoder 240 becomes logical H and the switch 254-2 is made to be short circuited, thereby supplying the second positive analog voltage value PV2 to the first A/D converter 236.

Moreover, the output "1" of the encoder 240 supplies logical H to an AND circuit 250-2. Also, the flip-flop 246 outputs logical H from its output 88, that is to be supplied to the AND circuit 250-2, in accordance with the negative edge of the positive pulse. Furthermore, the remaining input of the AND circuit 250-2, that is, the second positive timing signal PT2 has already changed from logical L to logical H. Thus, the AND circuit 250-2 changes its output from logical L to logical H. The positive edge output from the AND circuit 250-2 is supplied to a delay circuit 252 via an OR circuit 248-8 and is delayed by a predetermined time. Then, the delayed positive edge is supplied to the first A/D converter 236 via the OR circuit 248-1. The first A/D converter 236 then starts A/D conversion of the second positive analog voltage value PV2. Moreover, the delayed positive edge is also supplied to the reset of the flip-flop 246 via an OR circuit 248-3, thereby resetting the flip-flop 246.

When the A/D conversion of the second positive analog voltage value PV2 is finished, the first A/D converter 236 outputs the positive pulse from its end output. This positive pulse is supplied to the writing-control input WR of the first voltage memory 238 to place the first voltage memory 238 in the writable state. Then, data obtained by the A/D conversion is written into "1" address in the first voltage memory 238.

The positive pulse output from the end output of the first A/D converter 236 is also supplied to the binary counter 242 and the flip-flop 246. The binary counter 242 then increases its counted value from "1" to "2" in response to the negative edge of the positive pulse. Then, the output "2" of the encoder 240 becomes logical H and the switch 254-3 is short circuited, thereby supplying the third positive analog voltage value PV3 to the first A/D converter 236. In addition, the output "2" of the encoder 240 supplies logical H to an AND circuit 250-3. Furthermore, the flip-flop 246 outputs logical H from its output 88, that is to be supplied to the AND circuit 250-3, in response to the negative edge of the positive pulse. Then, the AND circuit 250-3 supplies a positive edge to the start input of the first A/D converter 236 in the same manner as that described above, in response to the change of the third positive timing signal PT3 to logical H, so that the first A/D converter 236 starts A/D conversion of the third positive analog voltage value PV3.

The same operation is repeated, so that the multiplexer selects one of the positive analog voltage values that is to be subjected to A/D conversion, the first A/D converter 236 performs the A/D conversion and the first voltage memory 238 stores the data obtained by the A/D conversion. Finally, in response to the change of the eighth positive timing signal PT8 from logical L to logical H that corresponds to the last positive analog voltage value to be converted, logical H is supplied to the data input D of the flip-flop 244. The flip-flop 244 then changes the positive end signal indicating that the first A/D converter 236 finishes the A/D conversion of all the positive analog voltage values (PV1 to PV8) to be converted to the digital voltage values, from logical L to logical H in accordance with the negative edge of the positive pulse that the first A/D converter 236 outputs when the A/D conversion of the eighth positive analog voltage value PV8 has been finished.

Figure 10:
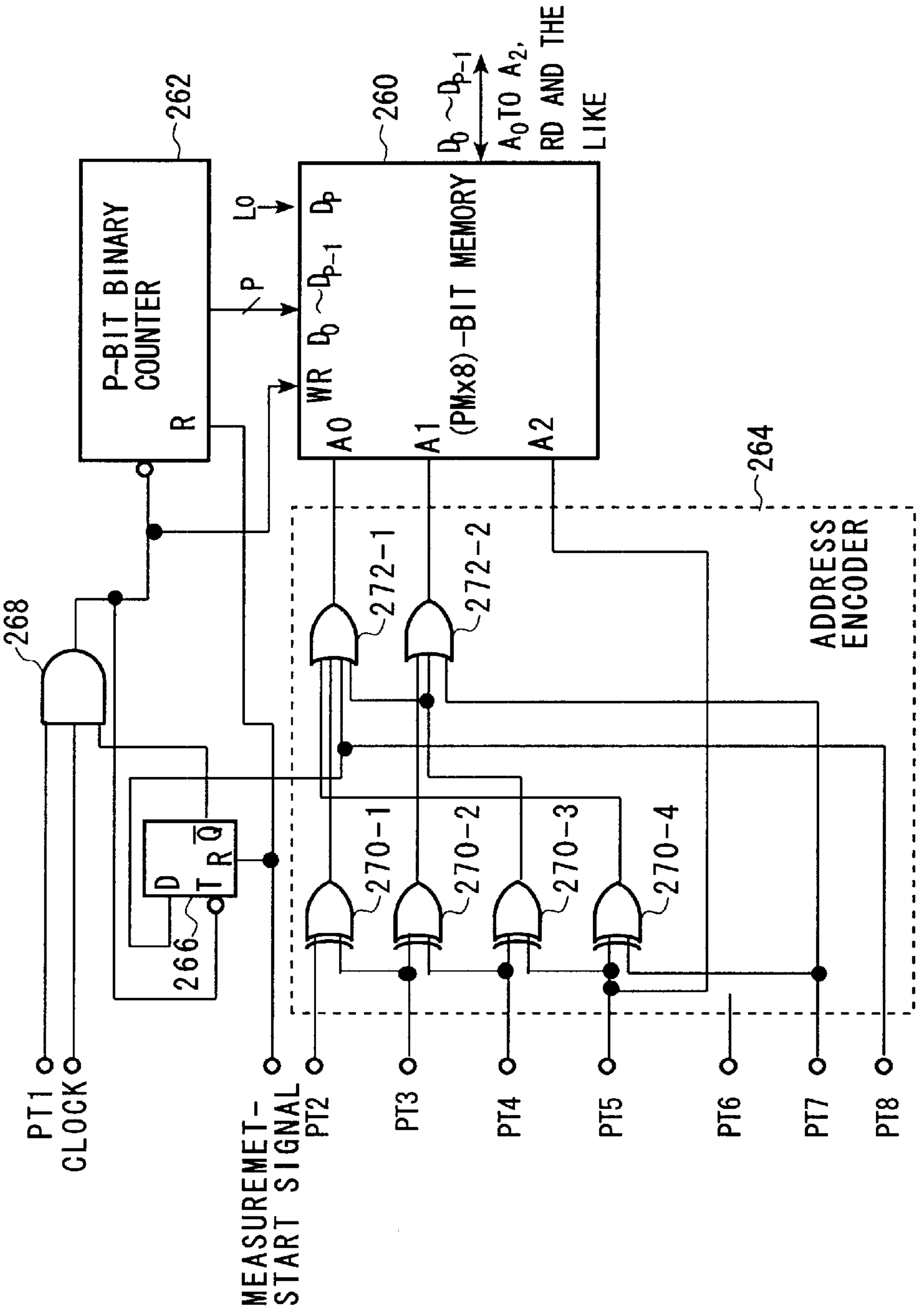
FIG. 10 shows an exemplary clock counting unit included in a counting unit of the time measuring device according to the present invention.

FIG. 10 shows the clock counting unit included in the counting unit. In FIG. 10, the first clock counting unit 128 where n=8 is shown as an example. The first clock counting unit 128 includes a first counter 262 that counts the number of clock edges between the change timings of the received positive timing signals (PT1 to PT8); a first clock memory 260 that stores the counted number of clock edges; and a first address encoder 264 that encodes an address in the first clock memory 260 at which the counted number of clock edges is to be stored based on the changes of the received timing signals (PT1 to PT8). The first address encoder 264 includes exclusive OR circuits (270-1 to 270-4) and OR circuits (272-1 and 272-2). It is preferable that the first counter 262 be a P-bit binary synchronizing counter in a case where a counting capacitance is P. The counting capacitance P (bits) of a δ-base counter is the smallest number that satisfies the following relationship, where the period of the reference clock is λ (seconds), the number of the positive timing signals supplied is κ, and the measurement time period is ξ (seconds).

$$\delta^P > (\xi/\lambda) \times \kappa$$

In the present embodiment, the counting capacitance P is 30 bits if the period of the reference clock is 8 ns and the measurement time period is 1 second. By using the binary synchronizing counter, a rate at which the writing operation is performed for the first clock memory 260 can be increased. In an alternative example, the first counter 262 may be a counter that is not a synchronizing type. Moreover, the base number of the first counter 262 may be a number other than 2.

FIGS. 11A, 11B and 11C show an example of a coding manner of the first address encoder 264 and exemplary data stored in the first clock memory 260. FIG. 11A shows the coding manner of the first address encoder 264. In the left table shown in FIG. 11A, "0" indicates each of the positive timing signals (PT1 to PT8) is logical L, while "1" indicates logical H. The positive timing signals (PT1 to PT8) change from logical L to logical H in the order from PT1 to PT8, as shown in FIG. 11A. Thus, each of the positive timing signals (PT1 to PT8) can have eight states. The right table in FIG. 11A shows encoded states of the eight states. In the present embodiment, the first address encoder 264 has a function of coding truth table shown in the left half of FIG. 11A into the right table.

FIGS. 11B and 11C show the exemplary data stored in the first clock memory 260. It is preferable that the first clock memory 260 have a data width larger than the counting capacitance by one bit. In the present embodiment, the first clock memory 260 has areas ($D_0$ to $D_{P-1}$) for storing the counted number of clock edges and areas $D_P$ each of which indicates whether or not the writing operation is performed at a corresponding address. It is preferable that "1" be written in the areas $D_P$ prior to the start of the measurement. In the measurement, "0" is written in the area $D_P$ corresponding to the address at which the writing operation was performed, while "1" is kept in the area $D_P$ corresponding to the address at which no writing operation was performed.

FIG. 11B shows a state where the numbers of the clock edges were respectively written at all the addresses from #0 to #7. In the areas ($D_0$ to $D_{P-1}$), the respective numbers of the clock edges are written. In all the areas $D_P$, "0" that indicates the writing operation was performed is written. FIG. 11C shows another state where the writing operation was not performed at the addresses #1, #2 and #4 to #6. In this case, the number of clock edges at each of the addresses at which the writing operation was not performed can be considered to be the same as the number of clock edges stored immediately above one of the addresses respectively corresponding to the areas $D_P$ in which "0" is written. For example, in FIG. 11C, the number of the clock edges between the change timing of the first positive timing signal PT1 and the change timing of the sixth positive timing signal PT6 is the same as the number of clock edges between the change timings of the first and the fourth positive timing signals PT1 and PT4. As described above, since the first clock memory 260 of the present embodiment has the areas $D_P$, it is possible to measure the time intervals even if the time intervals to be measured are shorter than the period of the clock.

Next, an operation of the first clock counting unit 128 is described. In the present embodiment, the first clock counting unit 128 counts the number of clock edges between the change timing of the first positive timing signal PT1 that is the first timing signal the first clock counting unit 128 received and the other positive timing signal (PT2 to PT8) than the first positive timing signal PT1, and stores the counted number in the first clock memory 260.

First, the first counter 262 and a flip-flop 266 are reset in response to the change of the measurement-start signal 10. Then, after the first positive timing signal PT1 is changed from logical L to logical H, an AND circuit 268 supplies logical H to the first counter 262 and a writing-control input WR of the first clock memory 260 in accordance with the positive edge of the clock. The first counter 262 then counts the number of negative edges of the clock that corresponds to the number of clock edges, and stores the counted number in the first clock memory 260. It is preferable that the number of clock edges be stored in the first clock memory 260 in response to the logical H of the clock. It is also preferable that the first counter 262 counts the number of clock edges in response to the negative edges of the clock. The change of the positive detection signal (PT1 to PT8) indicates the address in the first clock memory 260. For example, when the second positive timing signal PT2 changes from logical L to logical H. A0, A1 and A2 are indicated to be "1", "0" and "0" as the address in the first clock memory 260. At this address, the number of clock edges between the change timing of the first positive timing signal PT1 and the change timing of the second positive timing signal PT2 is written (see FIG. 11A). Similarly, the address at which the number of clock edges between the change timings of the first positive timing signal PT1 and the other positive timing signal (PT2 to PT8) is to be stored is indicated in response to the change of the other positive timing signal (PT2 to PT8) than the first positive timing signal PT1, so that the corresponding number of clock edges is stored at this address. It is preferable that the counted value before the counter increases its counted value in response to the negative edge of the clock be stored as the number of clock edges. Moreover, when the eighth positive timing signal PT8 is changed from logical L to logical H, an inverted output of the flip-flop 266 is inverted by the negative edge of the output of the AND circuit 268, so that logical L is supplied to the AND circuit 268. Thus, the AND circuit 268 outputs logical L and thereafter the first counter 262 does not count the clock edge.

In the present embodiment, since the clock counting unit has the address encoder and the clock memory, the necessary counter is one. Thus, circuit efficiency is excellent. In an alternative embodiment, the clock counting unit may measure the number of clock edges by having separate counters respectively provided for the timing signals for which the measurement is to be performed.

Figure 12:
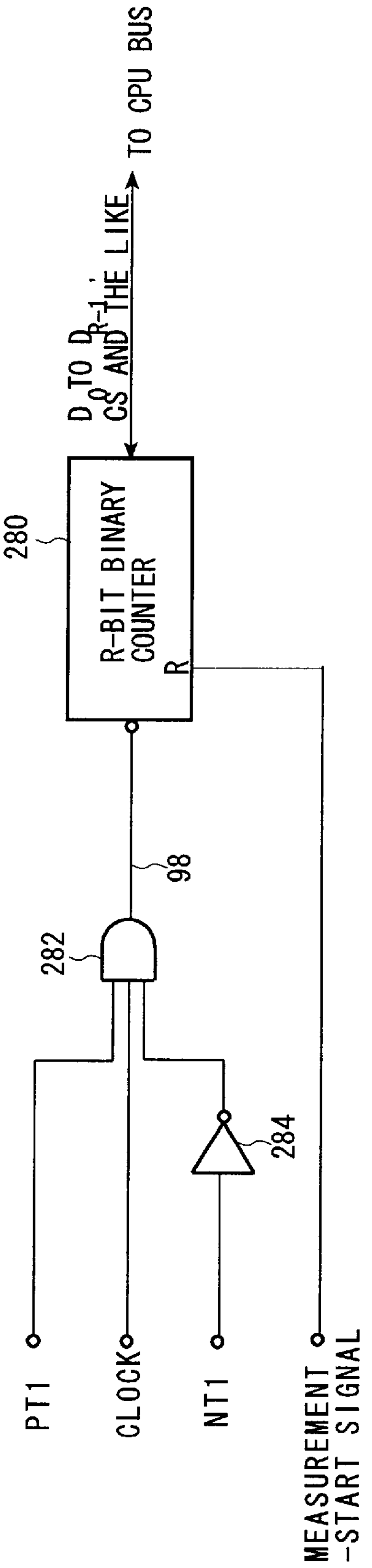
FIG. 12 shows an exemplary edge-difference detecting unit of the time measuring device according to the present invention.

FIG. 12 shows the edge-difference counting unit 130. The edge-difference counting unit 130 has an NOT circuit 284, an AND circuit 282 and a counter 280. The counter 280 is preferably a binary counter having a predetermined counting capacitance R. The edge-difference counting unit 130 counts the number of clock edges between the change timing of the positive timing signal (PT1 to PTn) and the change timing of the negative timing signal (NT1 to NTm). In the present embodiment, the edge-difference counting unit 130 counts the number of clock edges included in a period from the change timing of the first positive timing signal PT1 that is the first one of the positive timing signals, that changed after the first shift register 122 was reset, and the change timing of the first negative timing signal NT1 that is the first one of the negative timing signals, that changed after the second shift register 142 was reset.

Figure 13:
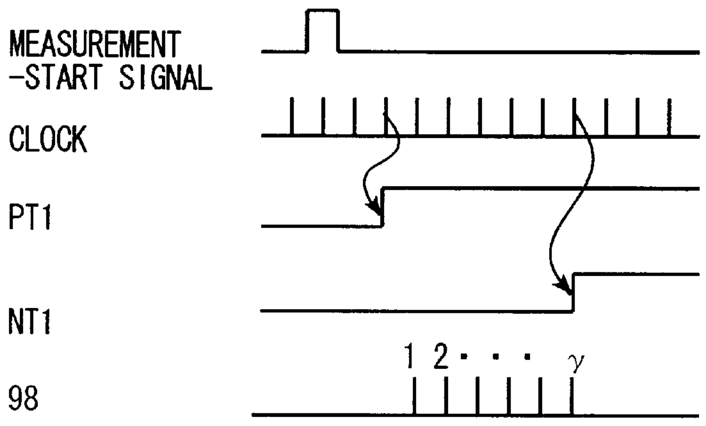
FIG. 13 is a timing chart of an operation of the edge-difference detecting unit.

FIG. 13 is a timing chart of an operation of the edge-difference counting unit 130. Referring to FIGS. 12 and 13, the operation of the edge-difference unit 130 is described. First, the counter 280 is reset by the change of the measurement-start signal 10.

The first negative timing signal NT1 is supplied to the AND circuit 282 after being inverted by the NOT circuit 284. Then, after the first positive timing signal PT1 changes from logical L to logical H, the AND circuit 282 outputs positive edges as its output 98 in accordance with clock edges. The counter 280 counts the number of these clock edges in accordance with the positive edges of the output 98 that indicate these clock edges. Then, in accordance with the change timing of the first negative timing signal NT1 from logical L to logical H, the NOT circuit 284 supplies logical L to the AND circuit 282. The counter 280 then holds the counted value obtained by counting the number of clock edges between the change timing of the positive timing signal PT1 and the change timing of the negative timing signal NT1.

Returning to FIG. 2, based on the end signal indicating the finish of the processing in the last one of the blocks that process the data required for the operation in the controlling unit 102, that was detected from the input signal PS, the controlling unit 102 receives the processed data, preferably. In the present embodiment, the first voltage digitizing unit 126 outputs the positive end signal 92 while the second voltage digitizing unit 148 outputs the negative end signal 94. Then, an AND circuit 40 supplies the end signal that is obtained as a logical product of the positive and negative end signals 92 and 94 to the controlling unit 102. The controlling unit 102 reads out the digital voltage values stored in the voltage memories, the number of clock edges stored in the clock memories and the counted value held by the counter of the edge-difference counting unit 130 via the bus. The controlling unit 102 then calculates the fraction times from the digital voltage values, and then calculates the time intervals of the edges in the input signal PS based on the fraction times, the number of clock edges and the counted value.

The time measuring device 100 of the present embodiment detects the edges in the input signal PS successively, and detects a positive edge first. Thus, when the fraction time corresponding to the k-th positive detection signal PEk is $Ta_k$; the fraction time corresponding to the h-th negative detection signal NEh is $Tb_h$; the number of clock edges between the change timings of the k-th positive timing signal PTk and the k'-th positive timing signal PTk' ($k<k'\leqq n$) is $\alpha_{kk'}$; the number of clock edges between the change timing of the h-th negative timing signal NTh and the change timing of the h'-th negative timing signal NTh' ($h<h'\leqq m$) is $\beta_{hh'}$; and the number of clock edges between the change timing of the first positive timing signal PT1 and the change timing of the first negative timing signal NT1 is $\gamma$, a positive period kk' that is a time interval between the k-th and k'-th positive edges in the input signal PS; a negative period hh' that is a time interval between the h-th and h'-th negative edges in the input signal PS; a positive pulse-width k that is a time interval between the k-th positive edge and the k-th negative edge; and a negative pulse-width h that is a time interval between the h-th negative edge and (h+1)-th positive edge are represented as follows.

$$\text{Positive period } kk'=\alpha_{kk'}\times T0+Ta_k-Ta_{k'}$$

$$\text{Negative period } hh'=\beta_{hh'}\times T0+Tb_h-Tb_{h'}$$

$$\text{Positive pulse-width } 1=\gamma\times T0+Ta_1-Tb_1$$

$$\textit{Negative pulse-width } h=(\textit{positive period } h)-(\textit{positive pulse-width } h)$$

$$\textit{Positive pulse-width } k=\textit{positive pulse-width } 1)+\sum_{i}^{k-1}(\textit{negative period } i)-\sum_{i}^{k-1}(\textit{positive period } i)$$

The display unit 104 then displays the time intervals between the edges in the input signal PS based on the result of the operation in the controlling unit 102.

The time measuring device 100 according to the present invention can receive the edges in the input signal PS and detect the edges to output the detected edges in parallel. Thus, it is possible to successively detect the timings of the edges even if the time intervals between the edges are extremely short. Moreover, the time measuring device 100 can obtain the parameters required for the measurement of the time intervals between the edges only by receiving the input signal PS once. In other words, mode selection that selects one of a mode for detecting the positive edge and another mode for detecting the negative edge, other mode selection that selects one of a mode for measuring the period and a mode for measuring the pulse width, and the like are not necessary. Thus, the operation from the edge detection to the calculation of the time intervals can be performed very easily. Accordingly, it is possible to successively and easily measure with high precision the time intervals between the edges in the input signal PS.

Figure 14:
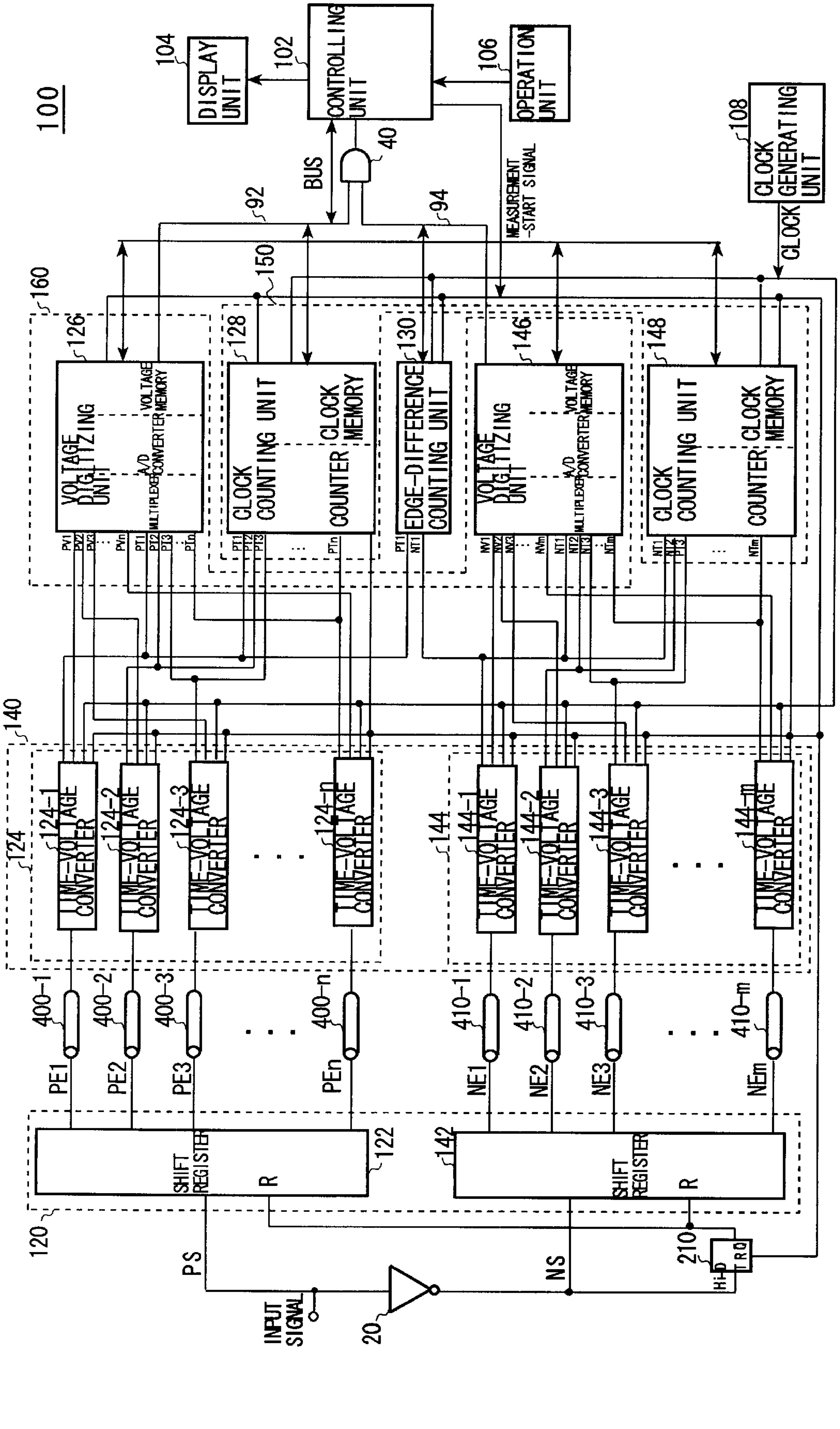
FIG. 14 shows another embodiment of the time measuring device 100 included in the testing apparatus 300.

FIG. 14 shows another embodiment of the time measuring device 100 included in the testing apparatus 300. The time measuring device 100 in this example further comprises a first transmission line which connects the input signal detecting unit 120 with the converting unit 140 electrically and transmits the detection signal. The first transmission line may be a cable. In this example, the first transmission line includes a first coaxial cable group (400-1 to 400-*n*) and a second coaxial cable group (410-1 to 410-*m*). A first coaxial cable 400-*a* of the first coaxial cable group transmits a-th positive detection signal PEa (1=<a=<n). The second coaxial cable 400-*b* of the second coaxial cable group transmits b-th negative detection signal NEb (1=<b=<m). Also, the testing apparatus 300 in this example further comprises a second transmission line which connects the signal inputting/outputting unit 306 with the input signal detecting unit 120 electrically and transmits the output pattern signal from the DUT 308. It is preferable that the transmission distance of the output pattern signal transmitted in the second transmission line is shorter than the transmission distance of one of the detection signals (PE1 to PEn, NE1 to NEn) transmitted in the corresponding coaxial cable (400-1 to 400-*n*, 400-1 to 400-*m*) Alternatively, the signal delay time of the output signal in the second transmission line may be shorter than the signal delay time of one of the detection signals (PE1 to PEn, NE1 to NEn) in the corresponding coaxial cable (400-1 to 400-*n*, 400-1 to 400-*m*). In this example, the second transmission line is a printed line on a substrate.

In this example, the test head includes the signal inputting/outputting unit 306 and the input signal detecting unit 120. In this example, the main body of the semiconductor device testing apparatus includes the converting unit 140, the counting unit 150, the controlling unit 102, and the digital converting unit 160.

Figure 15:
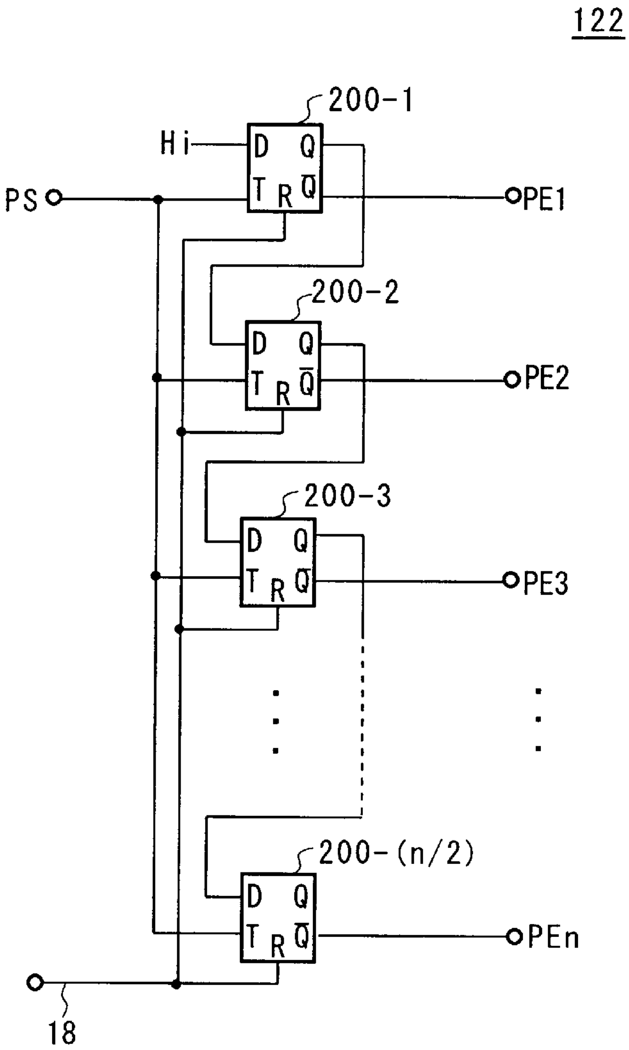
FIG. 15 shows an example of the first shift resister 122.

FIG. 15 shows an example of the first shift resister 122. The first shift resister 122 includes the input signal detecting unit 120. It is preferable that the second shift resister 142 has same structure as the first shift resister 122.

In this example, the first shift resister 122 includes n-number of flip flops (200-1 to 200-*n*) connected in series each other. In this example, it is preferable that the flip-flop 200 be a D flip flop having a data input terminal D, a trigger terminal T that receives the signal 18, an output terminal Q, and an inverse output terminal.

In this example, the k-th stage (1=<k=<n) flip-flop outputs the k-th positive detection signal PEk from the inverse output terminal. In this example, the data input terminal D of the k-th stage flip-flop receives the output signal output from (k-1)-th stage flip-flop. The data input terminal D of the first stage flip-flop receives logical H. In this example, the flip-flop 200 as a D flip-flop output the logical value, which the data input terminal D received, from the output terminal Q in response to the rising edge of the signal received in the trigger input terminal T. In this example, the flip-flop 200 is in reset state during the signal 18 shows logical H and outputs logical L from output terminal Q.

Figure 16:
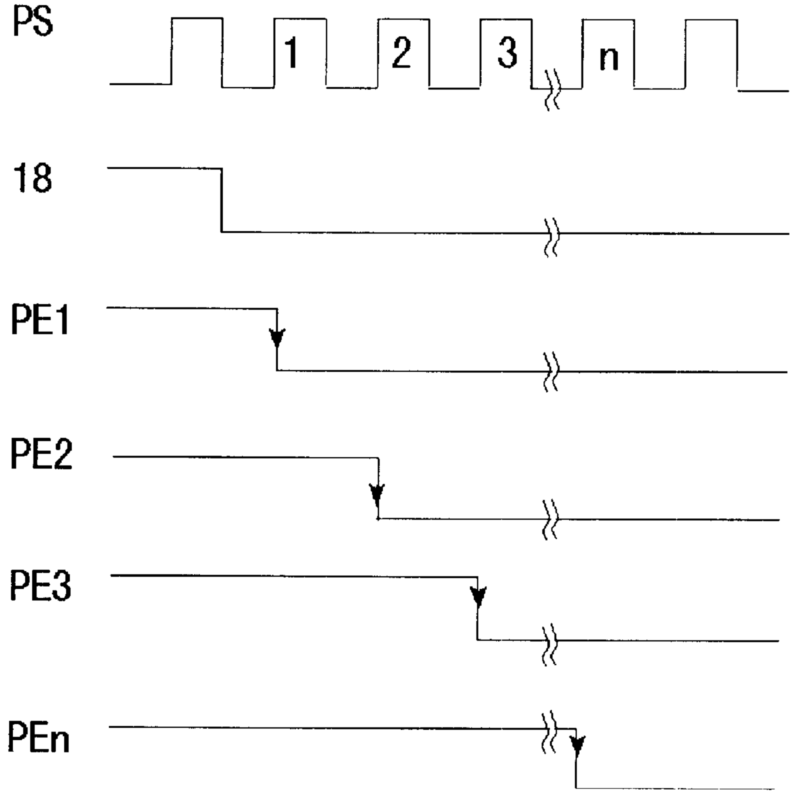
FIG. 16 is a timing chart of the operation of the first shift resister 122 in this example.

FIG. 16 is a timing chart of the operation of the first shift resister 122 in this example. First, the flip-flop 200 included in the first shift resister 122 becomes reset state in response to logical H of the signal 18. The flip-flop 200 outputs logical L from output terminal Q and outputs logical H from the inverse output terminal right after the reset state is released.

In this example, the data input terminal D of the first stage flip-flop receives logical H. Because of this, the first stage flip-flop (200-1) changes the inverse output as the first detection signal PE1 from logical H to logical L in response to the first rising edge of the input signal PS. At the same time, the first stage flip-flop (200-1) changes the output from logical L to logical H and provides the data input terminal of the second stage flip-flop (200-2) with this output. In this example, the second stage flip-flop (200-2) changes the inverse output, which is the second positive detection signal PE2, from logical H to logical L in response to the second rising edge of the input signal PS input in the trigger input terminal T. At the same time, the second stage flip-flop (200-2) changes the output from logical L to logical H and provides the third stage flip-flop, which is the next stage flip-flop, with this output.

In this example, the k-th stage flip-flop (200-*k*) changes the inverse output, which is the k-th positive detection signal PEk, from logical H to logical L. At the same time, the k-th stage flip-flop (200-*k*) changes the output from logical L to logical H in response to the k-th rising edge of the input signal PS input in the trigger input terminal T.

As described above, in this example, the first shift resister 122 changes the k-th positive detection signal PE(k) from logical H to logical L in response to the k-th rising edge of the input signal PS.

In this example, the coaxial cable groups (400-1 to 400-*n*, 400-1 to 400-*m*) transmit the detection signals (PE1 to PEn, NE1 to NEm) having only one rising edge, respectively. Because of this, the time measuring device 100 may measure the time intervals with high accuracy even in case that the rising edge roundness is different from the falling edge roundness occurred by the signal transmission in the coaxial cables (400-1 to 400-*n*, 410-1 to 410-*m*) Accordingly, the testing apparatus 300 of this example can transmit a signal for a long distance with coaxial cables connected between the test head and the main body of the device testing apparatus even in case that the output pattern signal, which is the input signal PS of the time measuring device 100, changes the logical value in short periods and is not suitable for along distance transmission.

The coaxial cable groups (400-1 to **400-*n*, 410-1 to 410-*m*) may include coaxial cables possible to be used only in a lower frequency bandwidth than the frequency of the output pattern signal. It is preferable that the coaxial cable groups (400-1 to 400-*n*, 410-1 to 410-*m***) include coaxial cables possible to be used in a frequency bandwidth around 100 MHz.

The input signal detecting unit 120 may include the shift resister 122 of the embodiment described in FIG. 4. It is preferable that the second shift resister 142 includes the same feature of the first shift resister 122. In this case, numbers of the flip-flops included in the input signal detecting unit 120 can be decreased half of the number of the flip-flops included in the input signal detecting unit 120 of the embodiment described in FIG. 15. Because of this, according to testing apparatus of this example, the mounting area of the input signal detecting unit 120 can be decreased.

As is apparent from the above description, according to the present invention, time intervals between edges in a signal can be measured with high precision even if the time intervals are very small.

Although the present invention has been described by way of exemplary embodiments, it should be understood that those skilled in the art might make many changes and substitutions without departing from the spirit and the scope of the present invention which is defined only by the appended claims.

What is claimed is:

1. A time measuring device comprising:

an input signal detecting unit operable to detect three or more edges in an input signal and to output three or more detection signals in parallel, said three or more detection signals changing based on said three or more edges, respectively;

a converting unit operable to convert phase differences between change timings of said detection signals and clock edges in a reference clock having a predetermined operating frequency into analog voltage values, respectively;

a counting unit operable to count, from change timings of at least two of said detection signals, numbers of said clock edges between said clock edges from which said at least two detection signals are respectively delayed by said phase differences corresponding to said at least two detection signals;

an operating unit operable to calculate a time interval between edges of said three or more edges based on said analog voltage values and said numbers of clock edges.

2. A time measuring device as claimed in claim 1, wherein said converting unit outputs three or more timing signals that respectively change based on said clock edges;

said counting unit counts, as said numbers of said clock edges, numbers of said clock edges between change timings of said three or more timing signals;

a digital converting unit is further provided to include an analog-digital converter operable to convert said analog voltage values into digital voltage values, respectively, and a voltage memory operable to store said digital voltage values; and said operating unit calculates said time interval based on said numbers of clock edges and said digital voltage values.

3. A time measuring device as claimed in claim 2, wherein said digital converting unit includes a selection unit operable to:

receive said three or more timing signals;

supply one of said analog voltage values that corresponds to one of said received timing signals, that changed first, to said analog-digital converter; and select one of said analog voltage values that respectively corresponds to remaining said timing signals one by one other than said timing signal that was changed first to supply said selected analog voltage values to said analog-digital converter one by one, based on an end of an operation for converting said analog voltage value that corresponds to said timing signal that changed first into a corresponding said digital voltage value by said analog-digital converter and changes of said timing signals.

4. A time measuring device as claimed in claim 2, wherein said counting unit includes:

a counter operable to count said number of said clock edges; and a clock memory operable to store said number of clock edges counted by said counter, and wherein said received timing signals indicate addresses in said clock memory at which said number of said clock edges corresponding to said received timing signals in accordance with an order in which said timing signals were received.

5. A time measuring device as claimed in claim 4, wherein said counting unit further includes an address encoder operable to encode said addresses based on changes of said received timing signals.

6. A time measuring device as claimed in claim 4, wherein said counting unit counts, as said number of said clock edges, number of said clock edges between a change timing of said one timing signal that changed first and change timings of said other timing signals than said one timing signal and stores said counted number of said clock edges in said clock memory.

7. A time measuring device as claimed in claim 4, wherein said operating unit reads said digital voltage values stored in said voltage memory and said number of said clock edges stored in said clock memory to calculate said time interval.

8. A time measuring device as claimed in claim 1, wherein said input signal detecting unit includes:

a first shift register operable to output positive detection signals as said detection signals that change based on positive edges in said input signal, said positive edges being edges at which said input signal changes from logical L to logical H; and a second shift register operable to input an inverted input signal obtained by inverting said input signal and to output negative detection signals as said detection signals that change based on negative edges in said input signal, said negative edges being edges at which said inverted input signal changes from logical L to logical H, and wherein said three or more detection signals are output in parallel.

9. A time measuring device as claimed in claim 8, wherein each of said first and second shift registers is a shift register including a plurality of flip-flops connected to each other, each of said flip-flops having a data input and a trigger input, said each of said flip-flops other than a last one of said flip-flops supplies data input to said data input thereof to said data input of a next one of said flip-flops in accordance with an edge change in said input signal or inverted input signal that is input to said trigger input thereof, and said last flip-flop supplies data obtained by inverting said data input to said data input thereof to said data input of a first one of said flip-flops in accordance with said edge change.

10. A time measuring device as claimed in claim 8, wherein said converting unit includes:

a first time-voltage converting unit operable to receive said positive detection signals, convert phase differences between change timings of said positive detection signals and said clock edges in said reference clock into positive analog voltage values as said analog voltage values, and output positive timing signals as said timing signals that change based on said clock edges and said positive analog voltage values; and a second time-voltage converting unit operable to receive said negative detection signals, convert phase differences between change timings of said negative detection signals and said clock edges in said reference clock into negative analog voltage values as said analog voltage values, and output negative timing signals as said timing signals that change based on said clock edges and said negative analog voltage values.

11. A time measuring device as claimed in claim 10, wherein said digital converting unit includes a first digitizing unit and a second digitizing unit, said first voltage digitizing unit includes: a first selection unit as said selection unit operable to receive said positive analog voltage values and said positive timing signals and to select one of said positive analog voltage values to be converted into one of said corresponding said digital voltage values; a first analog-digital converter as said analog-digital converter operable to convert said selected positive analog voltage value into a positive digital voltage value; and a first voltage memory as said voltage memory operable to store said positive digital voltage values, and said second voltage digitizing unit includes: a second selection unit as said selection unit operable to receive said negative analog voltage values and said negative timing signals and to select one of said negative analog voltage values to be converted into one of said corresponding said digital voltage values; a second analog-digital converter as said analog-digital converter operable to convert said selected negative analog voltage value into a negative digital voltage value; and a second voltage memory as said voltage memory operable to store said negative digital voltage values.

12. A time measuring device as claimed in claim 8, wherein said counting unit includes:

a first clock counting unit having a first counter as said counter operable to receive said positive timing signals and to count number of said clock edges between change timings of said positive timing signals, and a first clock memory as said clock memory operable to store said number of said clock edges counted by said first counter;

a second clock counting unit having a second counter as said counter operable to count number of said clock edges between change timings of said negative timing signals, and a second clock memory as said clock memory operable to store said number of said clock edges counted by said second counter, said change of said received positive timing signals indicate addresses in said first clock memory at which said counted number of said clock edges respectively corresponding to said received positive timing signals are stored, in accordance with an order in which said changes of said positive timing signals were received, said change of said received negative timing signals indicate addresses in said second clock memory at which said counted number of said clock edges respectively corresponding to said received negative timing signals are stored, in accordance with an order in which said changes of said negative timing signals were received.

13. A time measuring device as claimed in claim 8, further comprising an edge-difference counting unit operable to count a number of clock edges between a change timing of at least one of said positive timing signals and a change timing of at least one of said negative timing signals.

14. A time measuring device as claimed in claim 13, wherein said edge-difference counting unit counts a number of clock edges between a change timing of one of said positive timing signals, that changed first after said first shift register was reset, and a change timing of one of said negative timing signals, that changed first after said second shift register was reset.

15. A time measuring device as claimed in claim 13, wherein said first voltage digitizing unit outputs a positive end signal that changes after all said positive digital values to be stored in said first voltage memory have been stored, said second voltage digitizing unit outputs a negative end signal that changes after all said negative digital values to be stored in said second voltage memory have been stored, and said operating unit, after receiving a change of an end signal based on said positive end signal and said negative end signal, reads data from said first voltage memory, said second voltage memory, said first clock memory, said second clock memory and said edge-difference counting unit to calculate said time interval.

16. A testing apparatus for testing an electronic device, comprising:

a pattern generator operable to generate an input pattern signal to be input to said electronic device;

a signal inputting/outputting unit operable to supply said input pattern signal to said electronic device while being in electric contact with said electronic device, and to receive an output pattern signal output from said electronic device based on said input pattern signal; and a detecting unit operable to detect said output pattern signal output from said electronic device, wherein said detecting unit includes:

an input signal detecting unit operable to detect three or more edges in said output pattern signal and to output detection signals in parallel, said detection signals changing based on said three or more edges, respectively;

a converting unit operable to convert phase differences between change timings of said detection signals and clock edges in a reference clock having a predetermined operating frequency into analog voltage values, respectively;

a counting unit operable to count, from change timings of at least two of said detection signals, number of said clock edges between said clock edges from which said at least two detection signals are respectively delayed by said phase differences; and an operating unit operable to calculate a time interval between edges of said three or more edges based on said analog voltage values and said number of said clock edges.

17. A testing apparatus as claimed in claim 16, further comprising:

a first transmission line, which connects said signal inputting/outputting unit with said converting unit electrically, operable to transmit said three or more detection signals; and a second transmission line, which connects said signal inputting/outputting unit with said input signal detecting unit electrically, operable to transmit said output pattern signal, wherein a transmission distance of said output pattern signal transmitted in said second transmission line is shorter than a transmission distance of one of said three or more detecting signal transmitted in corresponding said first transmission line.

18. A testing apparatus as claimed in claim 16, further comprising:

a first transmission line, which connects said signal inputting/outputting unit to said converting unit electrically, operable to transmit said three or more detection signals; and a second transmission line, which connects said signal inputting/outputting unit to said input signal detecting unit electrically, operable to transmit said output pattern signal, wherein a signal time delay of said output pattern signal in said second transmission line is shorter than a signal time delay of one of said three or more detecting signal in said first transmission line.

19. A testing apparatus as claimed in claim 17, wherein said first transmission line is a coaxial cable.

* * * * *